US012726099B2

(12) United States Patent
Luo et al.

(10) Patent No.: US 12,726,099 B2
(45) Date of Patent: Sep. 1, 2026

(54) VARIABLE SLEW RATE HYBRID GATE DRIVERS FOR POWER MODULES

(71) Applicant: GM GLOBAL TECHNOLOGY OPERATIONS LLC, Detroit, MI (US)

(72) Inventors: Yilun Luo, Ann Arbor, MI (US); Benjamin S. Ngu, Rochester Hills, MI (US); Khorshed Mohammed Alam, Canton, MI (US); Mohammad N. Anwar, Van Buren Township, MI (US); Chandra S. Namuduri, Troy, MI (US); Michael Z. Pieszala, Panama City, FL (US); Brian A. Welchko, Oakland Township, MI (US); Rashmi Prasad, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 148 days.

(21) Appl. No.: 18/930,726

(22) Filed: Oct. 29, 2024

(65) Prior Publication Data

US 2026/0121508 A1 Apr. 30, 2026

(51) Int. Cl.

| | |
|---|---|
| ***H02M 1/00*** | (2006.01) |
| ***H02M 1/084*** | (2006.01) |
| ***H02M 1/088*** | (2006.01) |
| ***H03K 17/0812*** | (2006.01) |
| ***H03K 17/16*** | (2006.01) |

(52) U.S. Cl.

CPC ......... *H02M 1/0029* (2021.05); *H02M 1/084* (2013.01); *H02M 1/088* (2013.01); *H03K 17/08128* (2013.01); *H03K 17/168* (2013.01)

(58) Field of Classification Search

CPC .... H02M 1/0029; H02M 1/084; H02M 1/088; H03K 17/08128; H03K 17/168

USPC .......................................................... 323/282

See application file for complete search history.

(56) References Cited

U.S. PATENT DOCUMENTS

| | | | |
|---|---|---|---|
| 9,787,301 | B2 | 10/2017 | Sato |
| 10,110,217 | B2 | 10/2018 | Senda |
| 10,475,909 | B2 | 11/2019 | Basler et al. |

(Continued)

FOREIGN PATENT DOCUMENTS

| | | |
|---|---|---|
| DE | 102017109591 A1 | 11/2017 |
| DE | 112017004119 T5 | 5/2019 |

(Continued)

*Primary Examiner* — Yemane Mehari

(74) *Attorney, Agent, or Firm* — Quinn IP Law

(57) ABSTRACT

A gate driver for providing slew rate (SR) control of a power module (PM) includes input ports for receiving pulse-width-modulation (PWM) control signals transmitted from a processing system, voltage sources and gate resistors controlled by the PWM signals and having outputs coupled to a respective gate of at least one first transistor of a hybrid switch in the PM. The hybrid switch includes the at least one first transistor and at least one second transistor each comprising different semiconductor technologies. The gate driver also includes current sources controlled by the PWM signals and having outputs coupled to respective gates of the at least one second transistor of the hybrid switch in the PM. The voltage sources, the gate resistors, and the current sources are configured to provide the SR control of the PM to thereby compensate for the different semiconductor technologies in real time.

20 Claims, 10 Drawing Sheets

(56) References Cited

U.S. PATENT DOCUMENTS

| | | | | |
|---|---|---|---|---|
| 12,362,742 | B1 * | 7/2025 | Pieszala | H03K 17/122 |
| 2015/0035468 | A1 | 2/2015 | Allaert et al. | |
| 2017/0207782 | A1 | 7/2017 | Takizawa | |
| 2017/0302152 | A1 | 10/2017 | Watanabe et al. | |
| 2018/0026628 | A1 | 1/2018 | Lu et al. | |
| 2019/0237453 | A1 | 8/2019 | Nagase | |
| 2022/0329207 | A1 | 10/2022 | Spina et al. | |
| 2023/0275576 | A1 | 8/2023 | Baburske et al. | |
| 2024/0022161 | A1 | 1/2024 | Nguyen et al. | |
| 2024/0022946 | A1 * | 1/2024 | Luo | H03K 17/12 |
| 2024/0039403 | A1 * | 2/2024 | Ahn | H02M 3/07 |
| 2024/0176377 | A1 * | 5/2024 | Mademlis | G05F 1/66 |

FOREIGN PATENT DOCUMENTS

| | | | |
|---|---|---|---|
| DE | 102023100167 | A1 | 1/2024 |
| EP | 3514929 | A1 | 7/2019 |

* cited by examiner

VARIABLE SLEW RATE HYBRID GATE DRIVERS FOR POWER MODULES

INTRODUCTION

Power modules (PMs) include switches for driving different kinds of motors. The switches for the PM can include single semiconductor technologies or at least two different semiconductor technologies, such as with hybrid switches. Different technologies are employed with the understanding that their unique advantages and disadvantages may be used, with the goal of the design engineer to capitalize on the former while minimizing the latter. The types of different semiconductor technologies for use in PM applications is widespread. One example may include an insulated-gate bipolar transistor (IGBT) in parallel with a power metal-oxide-semiconductor field-effect transistor (MOSFET). The addition of the IGBT may reduce conduction losses in certain operating areas, while concurrently reducing wide bandwidth (WBG) device usage. One feature of using hybrid transistors or other circuit elements is that the differences between the devices may cause unprecedented second order effects including, for example, current imbalance, false "on" states, overvoltage spikes, overcurrent spikes, electromagnetic interference, and others.

SUMMARY

Disclosed herein is a gate driver for providing slew rate (SR) control of a power module (PM). The gate driver includes input ports for receiving pulse-width-modulation (PWM) control signals transmitted from a processing system, voltage sources and gate resistors controlled by the PWM signals and having outputs coupled to a respective gate of at least one first transistor of a hybrid switch in the PM. The hybrid switch includes the at least one first transistor and the at least one second transistor each including different semiconductor technologies. The gate driver also includes current sources controlled by the PWM signals and having outputs coupled to respective gates of the at least one second transistor of the hybrid switch in the PM. The voltage sources, the gate resistors, and the current sources are configured to provide the SR control of the PM to thereby compensate for the different semiconductor technologies in real time.

In one aspect of the disclosure the voltage sources, the gate resistors, and the current sources are configured to provide the SR control of the at least one first transistor and the at least one second transistor for one or more of: changing respective switching speeds; compensating for different input capacitances; compensating for differences in parasitic values; reducing a Miller current; reducing common mode current; reducing bearing current; optimizing a reverse recovery current; reducing transistor deadtime; optimizing current sharing between the at least one first transistor and the at least one second transistor; or providing top-level control of the hybrid switch.

In one aspect of the disclosure the gate driver includes an integrated apparatus physically separate from the processing system and the PM.

In one aspect of the disclosure the SR control is configured to compensate for capacitance differences between the at least one first transistor and the at least one second transistor of the hybrid switch, either with or without using PWM delay control.

In one aspect of the disclosure the SR control is configured to compensate for parasitic inductances between the at least one first transistor and the at least one second transistor of the hybrid switch, either with or without using PWM delay control.

In one aspect of the disclosure the SR control is configured to reduce reverse recovery current between the at least one first transistor and the at least one second transistor of the hybrid switch or between a diode coupled between non-gate terminals of one of the at least one first transistor and the at least one second transistor.

In one aspect of the disclosure the SR control is configured to reduce a deadtime of the PM either with or without using PWM delay control, to thereby reduce losses in an inverter with the PM or a motor coupled to the PM.

In one aspect of the disclosure the SR control is configured to reduce a Miller current corresponding to the hybrid switch either with or without using PWM delay control.

In one aspect of the disclosure the SR control is configured to mitigate a current-sharing imbalance between the at least one first transistor and the at least one second transistor of the hybrid switch either with or without using PWM delay control.

In one aspect of the disclosure the PM builds an inverter, the inverter operable to drive a motor with one of the at least one first transistor and the at least one second transistor of the hybrid switch including a wide bandgap (WBG) semiconductor and another of the at least one first transistor and the at least one second transistor includes a non-WBG transistor and the SR control is configured to use feed forward control with look-up tables (LUTs) to alter a SR of the hybrid switch based upon operating conditions.

In one aspect of the disclosure the operating conditions include one or more of a drain-to-source voltage ($V_{DS}$), an input direct current voltage ($V_{DC}$), transistor threshold voltage $V_{TH}$, transistor on-resistance ($R_{DS}$ON), motor phase current, junction temperature, motor temperature, circuit temperature, a value of one or more gate resistors, a value of one or more voltage sources, or a value of one or more gate current sources with the operating conditions.

In one aspect of the disclosure the gate driver is galvanically isolated from the processing system and the PM.

In one aspect of the disclosure a turn-on procedure of the hybrid switch includes a first time period in which at least one power transistor in an off-state has a steady positive value across non-gate terminals thereof, the steady positive value corresponding to an off-state. At or near the end of the first time period, one of the current sources are configured to apply a high gate current rated to the at least one second transistor at a high switching speed, reducing deadtime and switching delay. The turn-on procedure also includes a second time period during which the one or more of the current sources are configured to reduce a switching speed of the at least one second transistor by applying a lower, non-zero current to the respective gates of the hybrid switch to reduce dI/dt, overshoot, and ringing, while increasing switching speed. The turn on procedure also includes a third time period during which one or more of the current sources are configured to reduce a value of the respective gate currents to reduce dV/dt, overshoot, and ringing. The turn on procedure also includes a fourth time period during which the one or more of the current sources are configured to increase a value of the respective gate currents to a high or near maximum value to minimize an on-resistance across the at least one power transistor and to minimize conduction losses.

Disclosed herein is a vehicle. The vehicle includes a frame defining a body and a passenger cabin, a processing system coupled to a gate driver within the body and configured to send pulse width modulation (PWM) signals to the gate driver, voltage sources in the gate driver under control of the PWM signals, gate resistors in the gate driver under control of the PWM signals, and current sources in the gate driver under control of the PWM signals. The vehicle also includes a polyphase inverter including for each phase of a motor coupled to the inverter, one or more hybrid sets of switching transistors of different semiconductor technologies. Each of the current sources in the gate driver is coupled to a gate and at least one other terminal of a respective one of the hybrid sets of switching transistors. Each of the voltage sources and gate resistors in the gate driver is coupled to a gate and at least one other terminal of another respective one of the hybrid sets of switching transistors. The gate resistors and the current sources are configured to provide slew rate (SR) control of each respective phase of the inverter using respective variable gate resistance values and variable gate current values to compensate for the different semiconductor technologies in real time to reduce switching losses and improve inverter efficiency.

In one aspect of the disclosure each of the gate resistors and the current sources are coupled to the one or more hybrid sets of transistors in each of the phases of the motor to control the SR for effective capacitor discharge, to limit current or voltage overshoots, to control a temperature, current and voltage of the switching transistors, and to maintain the capacitors of the switching transistors and a battery coupled to the inverter within a safe operating limit.

In one aspect of the disclosure the gate driver is configured to control the SR to enable a multi-voltage level turn-off to reduce a soft turn-off time and to reduce voltage overshoot when the switch is in a short-circuit mode.

In one aspect of the disclosure the gate driver includes an active Miller clamp circuit to each of the one or more hybrid sets of switching transistors and a diode disposed across the Miller clamp circuit, the diode to protect a gate of the clamp circuit from a Miller current of other transistors.

In one aspect of the disclosure the processing system is further configured to adjust a ratio of usage of non-wide bandgap (WBG) switch(es) over WBG switch(es) based on feedback of the inverter or motor for reducing temperature and switching losses.

Disclosed herein is a hybrid gate driver apparatus for providing slew rate (SR) control of a power inverter module (PIM). The hybrid gate driver includes input terminals for receiving pulse-width-modulation (PWM) control signals transmitted from a processing system, voltage sources and gate resistors controlled by the PWM signals and having outputs coupled to a gate of at least one transistor of a switch in the PIM, the at least one transistor includes a single semiconductor technology, at least one of the voltage sources are coupled to at least one other non-gate terminal of the at least one transistor. The hybrid gate driver also includes current sources controlled by the PWM signals and having outputs coupled to the gate of the at least one transistor of the switch in the PM, at least one of the current sources coupled to the at least one other non-gate terminal of the transistor. The gate resistors, the voltage sources, and the current sources are configured to provide the SR control of the PIM to compensate for the different semiconductor technologies in real time to reduce switching losses and improve PM efficiency.

In one aspect of the disclosure the at least one transistor includes one of a wide bandgap (WBG) semiconductor or a non-WBG transistor

BRIEF DESCRIPTION OF THE DRAWINGS

The accompanying drawings, which are incorporated into and constitute a part of this specification, illustrate implementations of the disclosure and together with the description, explain the principles of the disclosure.

DETAILED DESCRIPTION

Figure 1:
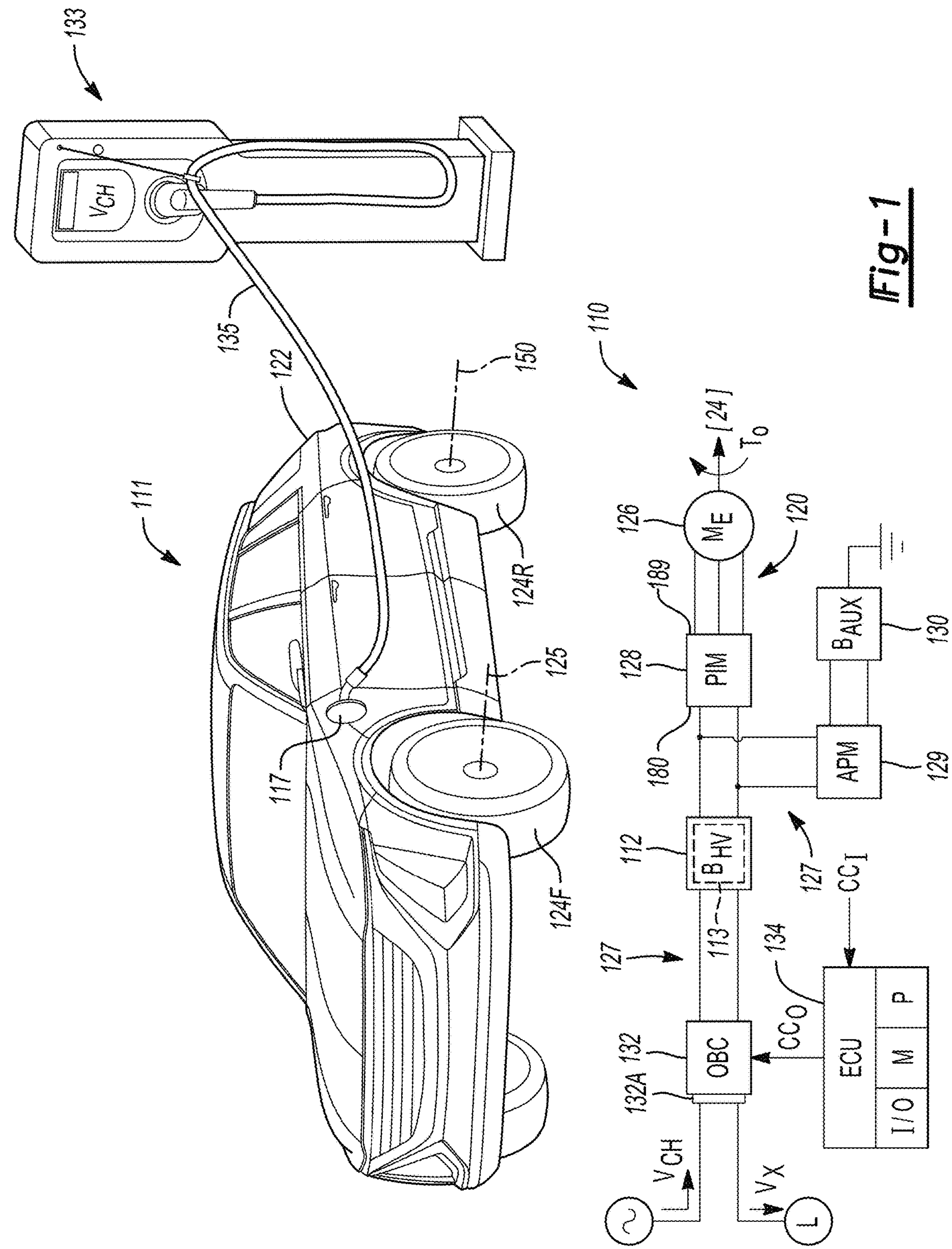
FIG. 1 is a plan view illustration of a vehicle, and a battery system coupled to an Electronic Control Unit (ECU) and a power inverter module (PIM) in which the principles of the present disclosure may be implemented.

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

While the principles of the present disclosure have wide application to diverse architectures involving optimizing switching performance, for purposes of example, electric vehicles are considered. It should be understood, however, that the disclosed gate driver apparatus has application to different implementations using hybrid semiconductor technology, e.g., to drive an electric motor in connection with a machine, such as by using a polyphase power inverter module (PPIM) for driving a three-phase electric motor. To that end, FIG. 1 is a plan view illustration of a vehicle and a battery system coupled to an Electronic Control Unit (ECU) and a power inverter module (PIM) in which the principles of the present disclosure may be implemented. In the embodiment of FIG. 1, an ECU performs the calibration internal to the vehicle. Advantageously, whenever it is deemed that the calibration has been decayed for whatever reason, or even on power-on, the ECU may apply the principles of the present disclosure to recalibrate each camera on the vehicle. That is to say, calibration may be performed on the vehicle using the described on-board electronics.

While an electric vehicle is shown in FIG. 1, it will be appreciated that the disclosure is not so limited and that the internal calibration procedures may be performed by each vehicle having the appropriate programmed circuitry. While the above hysteresis models may apply to a number of different physical configurations, FIG. 1 shows one such example. FIG. 1 depicts an electrified powertrain system 110 having a high-voltage battery pack ($B_{HV}$) 112 for which SOC estimations may be made. In a non-limiting example, the battery pack 112 may be embodied as a high-capacity battery having a voltage capability of about 400-800 volts or more, with the actual voltage capability of the battery pack 112 provided based on a desired operating/SOC range, gross weight, and power rating of a load connected to the battery pack 112. In a possible construction, the battery pack 112 may be a propulsion battery pack generally composed of an array of lithium-ion or lithium-ion polymer rechargeable electrochemical battery cells, which may be a cylindrical battery cell. The present teachings may also be applied to prismatic battery cells, and to pouch-style battery cells in possible configurations, and thus the cylindrical battery cell is exemplary without being limiting.

Although internal details of the battery cells in battery pack 112 are omitted for illustrative simplicity, those skilled in the art will appreciate that the battery cells contain within the cell cavity an electrolyte material, working electrodes in the form of a cathode and an anode, and a permeable separator (not shown), which are collectively enclosed inside an electrically insulated can or casing. Grouped battery cells may be connected in series or parallel through use of an electrical interconnect board and related buses, sensing hardware, and power electronics (not shown but well understood in the art). An application-specific number of the battery cells in battery pack 112 may be arranged relative to the battery tray 113 in columns and rows. In a nominal "xyz" Cartesian reference frame, for instance, the battery tray 113 when viewed from above or below may have a length (x-dimension) and a width (y-direction), with a height (z-dimension) extending in an orthogonal direction away from the battery tray 113.

In a representative use case, the electrified powertrain system 110 may be used as part of an EV 111 or another mobile system. As shown, the EV 111 may be embodied as a battery electric vehicle, with the present teachings also being extendable to plug-in hybrid electric vehicles. Alternatively, the electrified powertrain system 110 may be used as part of another mobile system such as but not limited to a rail vehicle, aircraft, marine vessel, robot, farm equipment, etc. Likewise, the electrified powertrain system 110 may be stationary, such as in the case of a powerplant, hoist, drive belt, or conveyor system. Therefore, the electrified powertrain system 110 in the representative vehicular embodiment of FIG. 1 is intended to be illustrative of the present teachings and not limiting thereof.

The EV 111 shown in FIG. 1 includes a vehicle body 122. The vehicle body 122 may include a frame within the vehicle body 122 to define areas for placement of mechanical and electrical components, as well as a passenger cabin. The EV may further include road wheels 124F and 124R, with "F" and "R" indicating the respective front and rear positions. The road wheels 124F and 124R rotate about respective axes 125 and 150, with the road wheels 124F, the road wheels 124R, or both being powered by output torque (arrow $T_O$) from a rotary electric machine ($M_E$) 126 of the electrified powertrain system 110 as indicated by arrow [24]. The road wheels 124F and 124R thus represent a mechanical load in this embodiment, with other possible mechanical loads being possible in different host systems. To that end, the electrified powertrain system 110 includes a power inverter module (PIM) 128 (also referenced herein as a power module (PM)) and the high-voltage battery pack 112, e.g., a multi-cell lithium-ion propulsion battery or a battery having another application-suitable chemistry, both of which are arranged on a high-voltage DC bus 127. As appreciated in the art, the PIM 128 includes a direct current ("DC") side 180 and an alternating current ("AC") side 189, with the latter being connected to individual phase windings (not shown) of the rotary electric machine 126 when the rotary electric machine 126 is configured as a polyphase rotary electric machine in the form of a propulsion or traction motor as shown.

The battery pack 112 of FIG. 1 in turn is connected to the DC side 180 of the PIM 128, such that a battery voltage from the battery pack 112 is provided to the power inverter module (PIM) 128 during propulsion modes of the EV 111. The PIM 128, or more precisely a set of semiconductor switches (not shown) residing therein, are controlled via pulse width modulation (PWM), pulse density modulation (PDM), or other suitable switching control techniques to invert a DC input voltage on the DC bus 127 into an AC output voltage suitable for energizing a high-voltage AC bus 120. As noted, the PIM 128 may also be referred to simply as a power module (PM), which may include an inverter or converter. High-speed switching of the resident semiconductor switches of the PIM 128 energizes the rotary electric machine 126 to thereby cause the rotary electric machine 126 to deliver the output torque (arrow $T_O$) as a motor drive torque to one or more of the road wheels 124F and/or 124R in another coupled mechanical load in other implementations.

Electrical components of the electrified powertrain system 110 may also include an accessory power module (APM) 129 and an auxiliary battery ($B_{AUX}$) 130. The APM 129 is configured as a DC-DC converter that is connected to the DC bus 127, as appreciated in the art. In operation, the APM 129 is capable, via internal switching and voltage transformation, of reducing a voltage level on the DC bus 127 to a lower level suitable for charging the auxiliary battery 130 and/or supplying low-voltage power to one or more accessories (not shown) such as lights, displays, etc. Thus, "high-voltage" refers to voltage levels well in excess of typical 12-15V low/auxiliary voltage levels, with 400V or more being an exemplary high-voltage level in some embodiments of the battery pack 112.

In some configurations, the electrified powertrain system 110 of FIG. 1 may include an on-board charger (OBC) 132 that is selectively connectable to an off-board charging station 133 via an input/output (I/O) block 132A during a charging mode during which the battery pack 112 is recharged by an AC charging voltage ($V_{CH}$) from the off-board charging station 133. The I/O block 132A is connectable to a charging port 117 on the vehicle body 122. For instance, a charging cable 135 may be connected to the charging port 117, e.g., via an SAE J1772 connection. The electrified powertrain system 110 may also be configured to selectively receive a DC charging voltage in one or more embodiments as appreciated in the art, in which case the OBC 132 would be selectively bypassed using circuitry (not shown), e.g., that may be used to charge and/or discharge the battery pack 112 gradually for performing various functions, such as testing the SOC. The OBC 132 could also operate in different modes, including a charging mode during which the OBC 132 receives the AC charging voltage ($V_{CH}$) from the off-board charging station 133 to recharge the battery pack 112 after a low charge indicator light displays on the dashboard, and a discharging mode, represented by arrow $V_X$, during which the OBC 132 offloads power from the battery pack 112 to an external AC electrical load (L). In this manner, the OBC 132 may embody a bidirectional charger.

Still referring to FIG. 1, the electrified powertrain system 110 may also include an electronic control unit (ECU) 134. The ECU 134 is operable for regulating ongoing operation of the electrified powertrain system 110 via transmission of electronic control signals (arrow $CC_O$). The ECU 134 does so in response to electronic input signals (arrow $CC_I$). Such input signals (arrow $CC_I$) may be actively communicated or passively detected in different embodiments, such that the ECU 134 is operable for determining a particular mode of operation. In response, the ECU 134 controls operation of the electrified powertrain system 110. Thus, the ECU and its accompanying components may act as a battery management system ("BMS") for performing functions including estimating the SOC, etc.

To that end, the ECU 134 may be equipped with one or more processors (P), e.g., logic circuits, combinational logic circuit(s), Application Specific Integrated Circuit(s) (ASIC), electronic circuit(s), central processing unit(s), semiconductor IC devices, etc., as well as input/output (I/O) circuit(s), appropriate signal conditioning and buffer circuitry, and other components such as a high-speed clock to provide the described SOC functionality in prior figures, as well as different functions identified by the CC input signal. The ECU 134 also includes an associated computer-readable storage medium, i.e., memory (M) inclusive of read only, programmable read only, random access, a hard drive, etc., whether resident, remote or a combination of both. Control routines, including code for executing the SOC model with hysteresis, are executed by the processor to monitor relevant inputs from sensing devices and other networked control modules (not shown), and to execute control and diagnostic routines to govern operation of the electrified powertrain system 110. The I/O circuits may be directly coupled to the ECU 134, along with memory M and one or more processors P for executing code that estimates SOC. In an aspect, the BMS system may collectively be realized as ECU 134, OBC 132 and bus 127. OBC 132 and bus 127 may be an apparatus within the BMS or included as part of the BMS that is enabled to be connected to the outer terminals of battery pack 112 to perform the functions recited herein. In some implementations, the BMS may be coupled directly with the battery pack.

EV 111 may, like other vehicles, include a dashboard implanted within or otherwise connected to the body of EV 111. The body houses a cabin where the driver and occupants reside. The apparatus discussed above may include control signals to the dashboard and conversion circuitry to enable the driver to assess the SOC remaining based on an amount or percentage of charge remaining, an estimated time that the vehicle will die or imminently needs recharging, and other data. At least some of these aspects may be computed by the BMS, including ECU 134 and its associated processor P running code from memory M. Messages may be sent via the I/O circuit to other parts of the vehicle, via $CC_O$ or another connection not specifically shown.

In another embodiment, ECU 134 along with its I/O, memory and processor may additionally or alternatively be used to calibrate and recalibrate each of the cameras in the EV, or selected ones. In this case, the flow diagrams above may be run on the processor and the ECU 134 may be appropriately connected to carry out calibrations for each of the cameras. This may occur during suspected miscalibrations caused by force events, or it may simply be recalibrated every X times the driver turns on the EV 111. It should be noted again that another type of combustion based, or hybrid vehicle may be used in this embodiment. This embodiment also obviates the expensive and time-consuming need to implement calibrations independently for each of the vehicles at startup. ECU 134 may be coupled to each of the cameras via a hardwire or networked connection, or it may be connected to selected cameras.

In the above example, the PIM 128 (or more simply, the PM) may include a set of semiconductor switches driven by a modulation technique such as PWM (although other suitable modulation techniques such as PDM may be used). In other configurations, the ECU or a microcontroller unit (MCU) therein (e.g., processor P) may also be used to govern the transmission of modulated signals. The semiconductor switches of PIM 128 may include power transistors, and the modulation technique used to drive them may include intermediary circuitry to suitably decode the PWM signals where needed and to adjust the rail-to-rail voltage swing from power used by logic circuits (e.g., 0 to 5 volts, or the like) to the higher voltages needed by a gate driver to switch the power transistors that drive the rotary electric machine 126. With reference to the PIM 128, a gate driver may be employed to turn the power transistors/switches on and off.

The gate driver apparatus, described further below, turns the power transistors on and off to convert the DC-based power to AC-based power. With existing implementations, faster switching by the gate driver of the power transistors may reduce switching losses and improve maximum power capability, but at a cost. The faster switching also increases overshoot and slew rate (SR). Slew rate as noted embodies the rate of change of voltage or current of the switching transistor (e.g., dV/dt, dI/dt, where V is voltage in volts, and I is current in Amperes (Amps). This increased overshoot leads to problems in traditional motor implementations. They include (i) higher electrical stress on power switches, that may cause physical damage, (ii) higher ringing, conductive, and radiated electromagnetic interference (EMI) that may cause errors in intended voltage/logic values, or even physical damage to the PM or motor if the EMI is severe enough, and (iii) higher motor terminal voltage overshoot (partial-discharge-inception-voltage or "PDIV") and bearing current.

Figure 2:
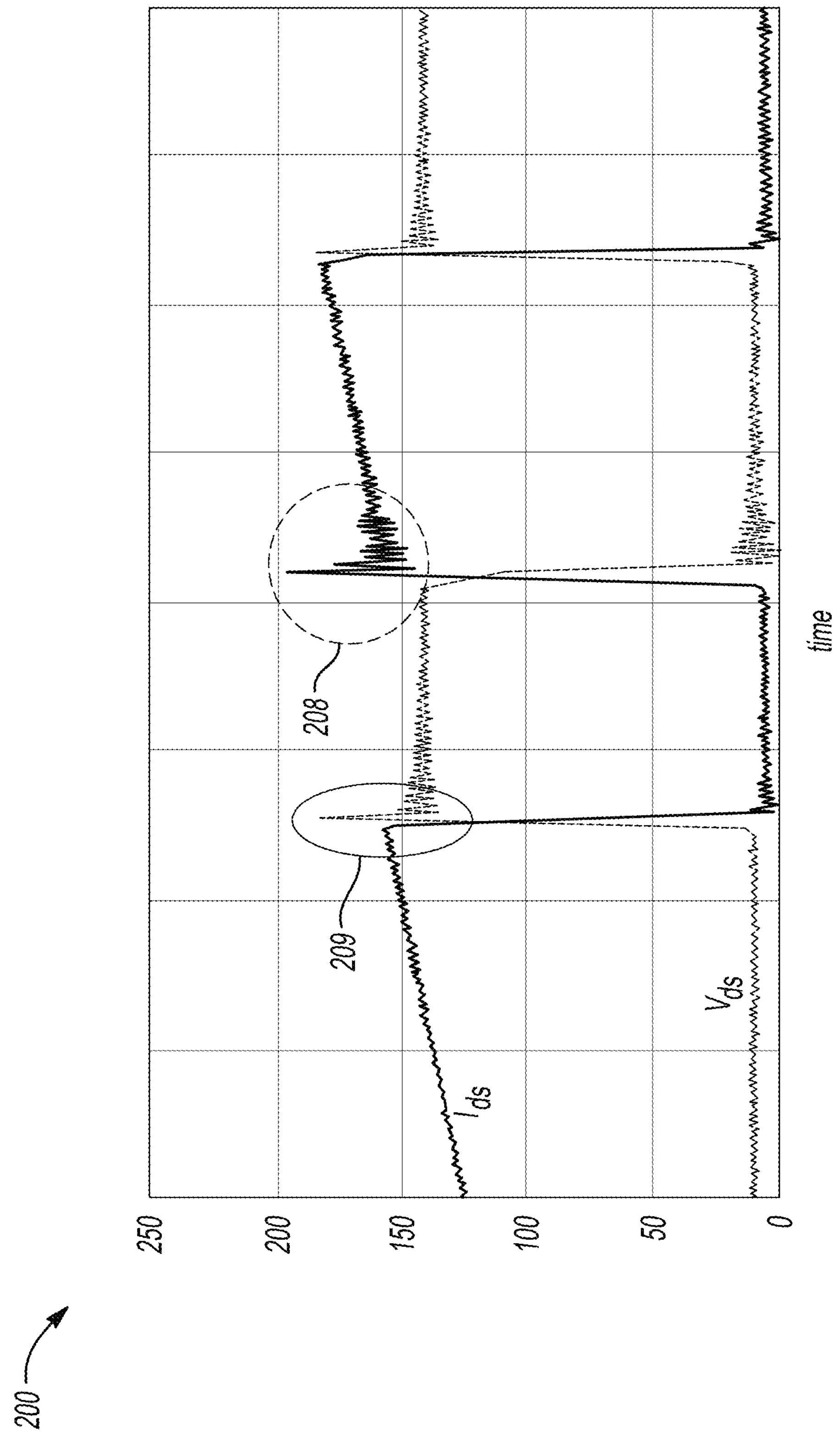
FIG. 2 is a timing diagram illustrating an example of current and voltage overshoot and ringing resulting from high switching speeds of power transistors in a power module (PM).

FIG. 2 is a timing diagram 200 illustrating current and voltage overshoot and ringing resulting from high switching speeds of power transistors in a power module (PM). The horizontal axis represents time, and the vertical axis represents amplitude (volts in the case of voltage, Amperes (Amps) in the case of current). When the circuit element is switched at high speeds, large overshoots followed by ringing in the drain-to-source voltage $V_{ds}$ and the drain current Ids become apparent. The first visible turn-off point causes the voltage $V_{ds}$ to generate a large voltage spike 209, with visible ringing in $V_{ds}$ prior to settling to a value closer to steady-state. Similarly, at the next stage wherein the switch is turned on and $V_{ds}$ rapidly returns to a value near zero, the high-speed Ids turn-on results in current spike 208, followed by ringing, or wavering back and forth as shown in the waveform until returning to its equilibrium value. The overshoots and ringing in these waveforms also result in the generation of EMI and other second-order effects, which may interfere with surrounding signals and result in higher-than-usual current values across the PM.

Exceedingly high ringing values may also result in damage to the circuit. The gate driver turns the power semiconductors on and off to convert electrical power between direct current (DC) and alternating current (AC). Faster switching times may also be advantageous in that switching loss is reduced and maximum power capability may be achieved. However, in existing implementations, faster switching also increases voltage and current overshoot as exemplified in FIG. 2, which in turn causes the above-described problems.

Figure 3:
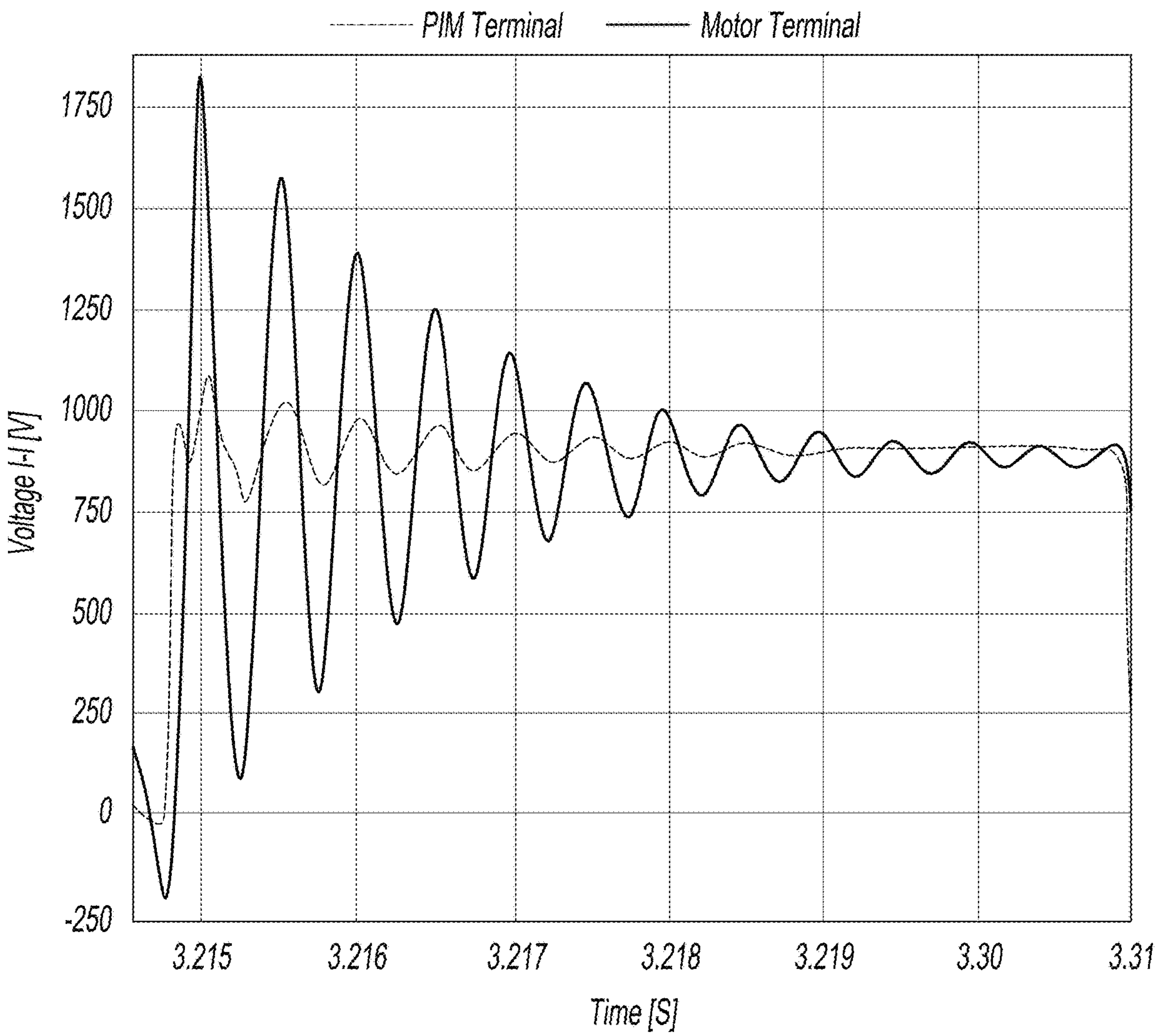
FIG. 3 is a timing diagram illustrating an example of a winding overvoltage resulting from a fast switching speed driving an electric motor.

Still another problem in existing implementations includes winding overvoltage. FIG. 3 is a timing diagram illustrating an example of a winding overvoltage resulting from a voltage with a fast slew rate switching a phase of an electric motor. The horizontal axis in FIG. 3 represents time in seconds. The vertical axis in FIG. 3 represents voltage in volts. The solid line represents a waveform for the voltage of the motor terminal and more specifically the motor's line-to-line voltage at a fixed number of revolutions-per-minute, while the dashed line represents the output of the PIM driving the motor. Referring initially to the left side of the drawing, the voltage of the PIM terminal switches at a high speed from just beneath zero volts to a positive value (in this example, almost 1000 volts). This sudden switch causes the maximum line-to-line voltage of the motor to achieve a value of approximately 1700 volts. While the actual overshoot may vary widely depending on the details of the switches and the configuration of the motor, the apparatus may not be rated to withstand such high voltages, resulting in potential damage to the equipment and at best, an imbalance in the operation of the motor. As the PIM terminal slowly reaches an equilibrium point at about 3.219 seconds, the winding overvoltage also takes time to reach a stable value. Winding overvoltage resulting from an excessive SR at the PIM terminal may cause functional and operational problems to the motor.

In addition to the above-referenced problems associated with PMs and motors, it is well understood that fast switching periods may also create undesirable common mode voltages and currents in the motor, which currents are proportional to the rate of change (dV/dt) of the switching voltage. These common mode currents, in turn, may lead to bearing current which may damage the motor. In short, failures due to bearing currents often result from these common mode artifacts, which may result in damage to the bearings.

As noted, to reap the benefits of different semiconductor technologies while attempting to address the above deficiencies, hybrid semiconductor circuits for use in switching have been developed or proposed in the literature. As further noted, the principles of the present disclosure may apply to a variety of two or more types of semiconductors for use in power-switching application, including switching circuits incorporating two or more of silicon (Si), silicon carbide (SiC), gallium nitride (GaN), gallium oxide ($Ga_2O_3$), diamond transistors, insulated-gate bipolar transistors, metal-oxide semiconductor field effect transistors (MOSFETs), high-electron-mobility transistors (HEMTs), junction field-effect transistors (JFETs), Cascode field-effect transistors (Cascode FETs), and bipolar-junction transistors (BJTs), to name a few. As noted, using a hybrid switch that incorporates a power MOSFET in parallel with an IGBT allows for considerable SR improvement. Problems with these and other hybrid solutions nonetheless persist in the current state of the art. A few of the second order effects caused by integrating different semiconductor technologies, such as current imbalances, false ONs, overvoltage spikes, and EMI were alluded to above. Furthermore, traditional gate drivers provide one or a few slew rates at best, the latter of which are limited to handling extreme conditions rather than regular operational use.

To meet these challenges, one aspect of the disclosure takes a different tact altogether, driving the power transistors with a current, rather than a voltage. This current may be used to create piecewise functions that effectively "tune" the turning on and turning off of each power switch in a manner that combines the efficiency of fast switching with the reduction of undesirable artifacts such as overshoot, ringing, and EMI.

Accordingly, another aspect of the disclosure combines the advantages of the use of hybrid switches with unique circuits that provide in or near-real time SR control of the block of hybrid PMs on a regular operational basis. In various embodiments, the principles of the disclosure use current sources (CSs) to optimally adjust the output currents to the gates of the switching transistors or to the dies of the hybrid PMs. The use of current sources for this purpose enables the PM to achieve multiple SRs, with or without PWM delay control. The availability of multiple SRs, in turn, enables different such SRs to compensate for fundamental differences between the hybrid switches and their internal dies and thereby eliminate or reduce the aforementioned deficiencies inherent in traditional switching techniques. The combination of the real time SR control with the benefits of the hybrid power switches has benefits. To name a few, they include improved current sharing to obtain a suitable balance between switches or transistor dies, reduced losses incurred during switching, reduced time periods and amplitudes of reverse recovery events, reduced overshoot, reduced EMI, and reduced bearing current.

Figure 4A:
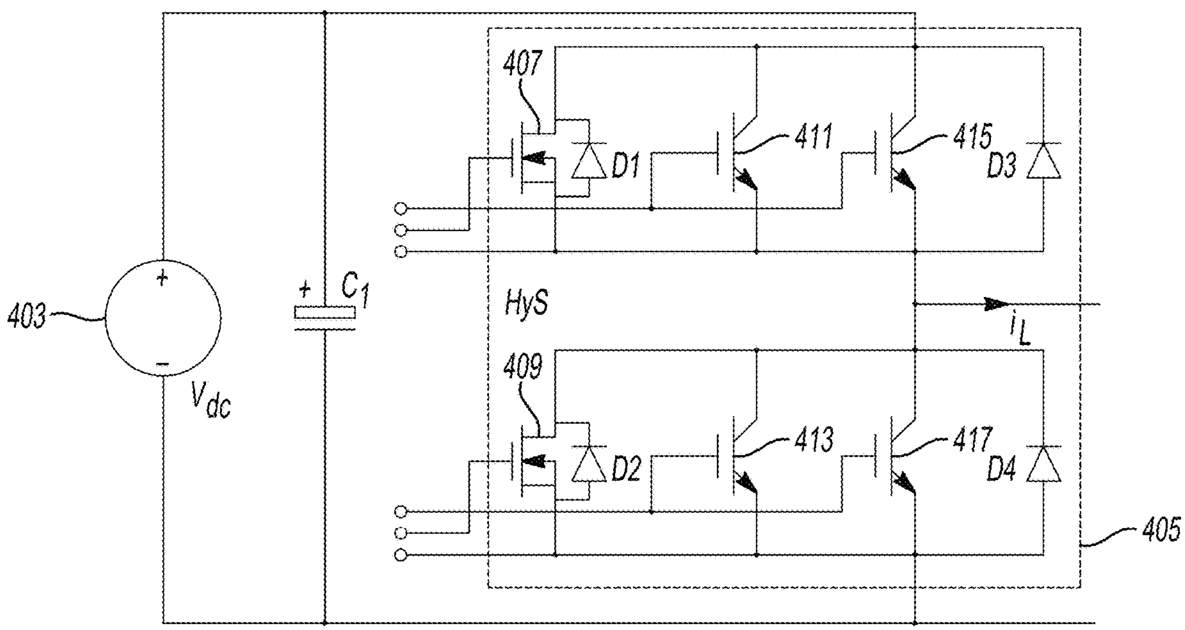
FIG. 4A is an example of an inverter incorporating a hybrid switch, the PM driven by a direct current ("DC") voltage source.

FIG. 4A is an example of a power module (PM) incorporating hybrid switches 405 and driven by a DC voltage source 403. The hybrid switches 405 integrate switches of different technologies (such as those noted above) to enhance their mutual advantages and compensate for their conflicts. The PM in this example is connected to a DC voltage source 403 in parallel with a parallel capacitor C1. Hybrid switches include SiC MOSFETs 407 and 409, whose drain and source include in parallel respective diodes D1 and D2. The other hybrid switches include IGBTs 411, 415, 413 and 417. A diode D3 is included across the non-gate terminals of transistors 407, 411 and 415. A diode D4 is included across the non-gate terminals of transistors 409, 413, and 417. As described further below, a hybrid gate driver (HGD) controls the timing of the input PWM signals and voltages sources in connection with gate resistors and the output gate current to optimize the switching speeds of the different transistors. One objective is to allow a zero-voltage switching (ZVS) of the IGBT and thereby improve the overall switching speed, loss, overshoot, reverse recovery ringing EMI, dV/dt, dI/dt, and common mode and bearing currents. In this case, Si IGBT semiconductor technology is advantageously inexpensive, but it is associated with a higher switching loss to larger parasitic capacitances and tail currents. By contrast, SiC MOSFET technology has a lower switching loss and improved thermal conductivity. The PWM circuit driving the gate driver may do so in a way that enhances the benefits specific to each transistor technology.

It should be noted that, while the PM in this example includes silicon diodes D3 and D4 across the respective collectors and emitters of IGBTs 415 and 417, other embodiments need not include these diodes. Many different configurations are possible for various semiconductor technologies, and each of which is intended to fall within the spirit and scope of the present disclosure.

Figure 4B:
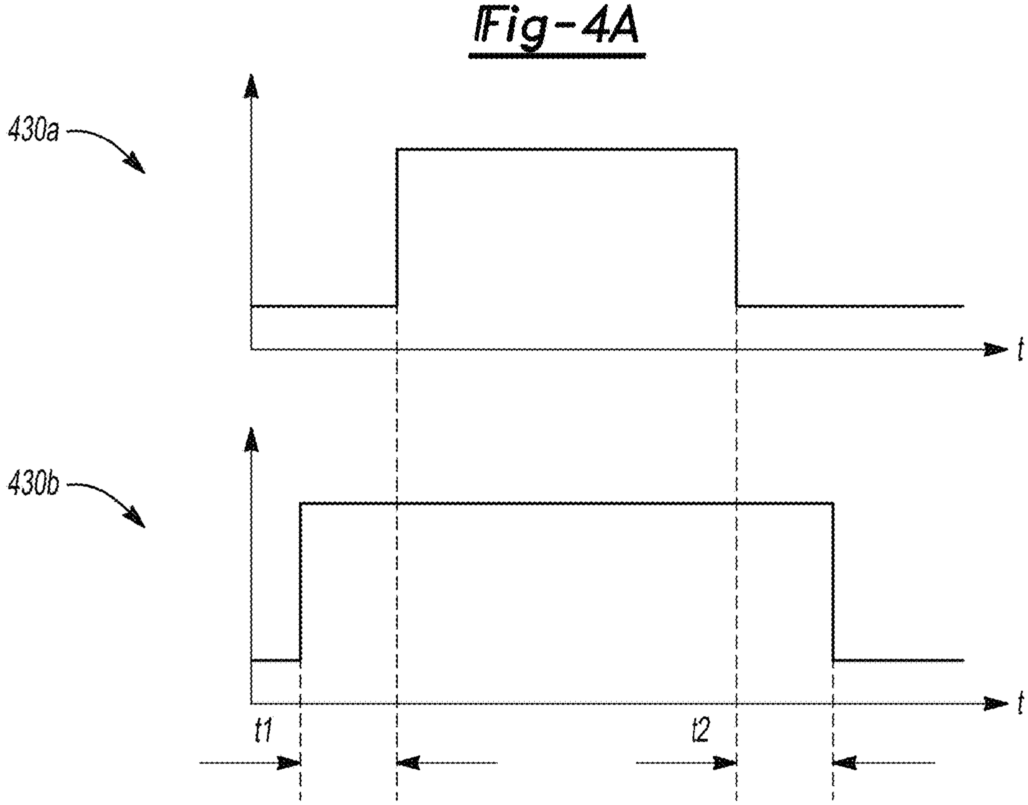
FIG. 4B are respective timing diagrams of the PWM voltage switching waveform of a silicon insulated-gate bipolar transistor (Si IGBT) (upper) and a silicon-carbide metal oxide semiconductor field effect transistor (SiC MOSFET) (lower).

FIG. 4B is a timing diagram of the PWM switching pulse 430*a* of a silicon insulate-gate bipolar transistor (IGBT) compared with the PWM pulse 430*b* of a silicon carbide MOSFET, such as used in the PM 403 in FIG. 4A. Ideally, the processing system would output square waves having a width dependent in part on the properties of the IGBT (e.g., gate size, transistor dimensions, etc.) and the desired switching speeds and frequencies. Also shown in FIG. 4B, as noted, is the PWM timing diagram for a corresponding SiC MOSFET. There exists a noticeable delay time $t_1$ between the PWM switching time of the MOSFET versus that of the IGBT. Likewise, a delay time $t_2$ also exists when comparing the opposite side of the PWM pulse to the MOSFET versus the IGBT. In a manner further discussed below, the HGD may receive the PWMs signal and use the delays and control the pulse width of these signals using the respective gate resistor or gate current, discussed below, in order to adjust the switching speeds, losses and overshoots of the respective hybrid transistors. That is to say, the HGD may control the gate resistor and gate current and PWM output in a manner that optimizes the respective switching speeds of the transistors using different semiconductor technologies and may introduce PWM delays that align or otherwise orient the pulses.

In an aspect of the disclosure, a hybrid gate driver (HGD) is used to drive hybrid PMs including switches composed of different semiconductor technologies. Unlike existing approaches, the HGD uses voltage sources (VSs) in connection with gate resistors and current sources (CSs) to provide variable output voltages and output currents, respectively, to the gates of the individual switches, dies, or combination of the hybrid PM to precisely control switching SR in or near real time. In various embodiments, the use of the HGD may be combined with the traditional PWM delay control to further improve performance. The gate driver's output circuit may be supplied by different voltage sources designed to be optimal to the different semiconductor technologies to further reduce conduction loss and electromagnetic interference (EMI).

Figure 5:
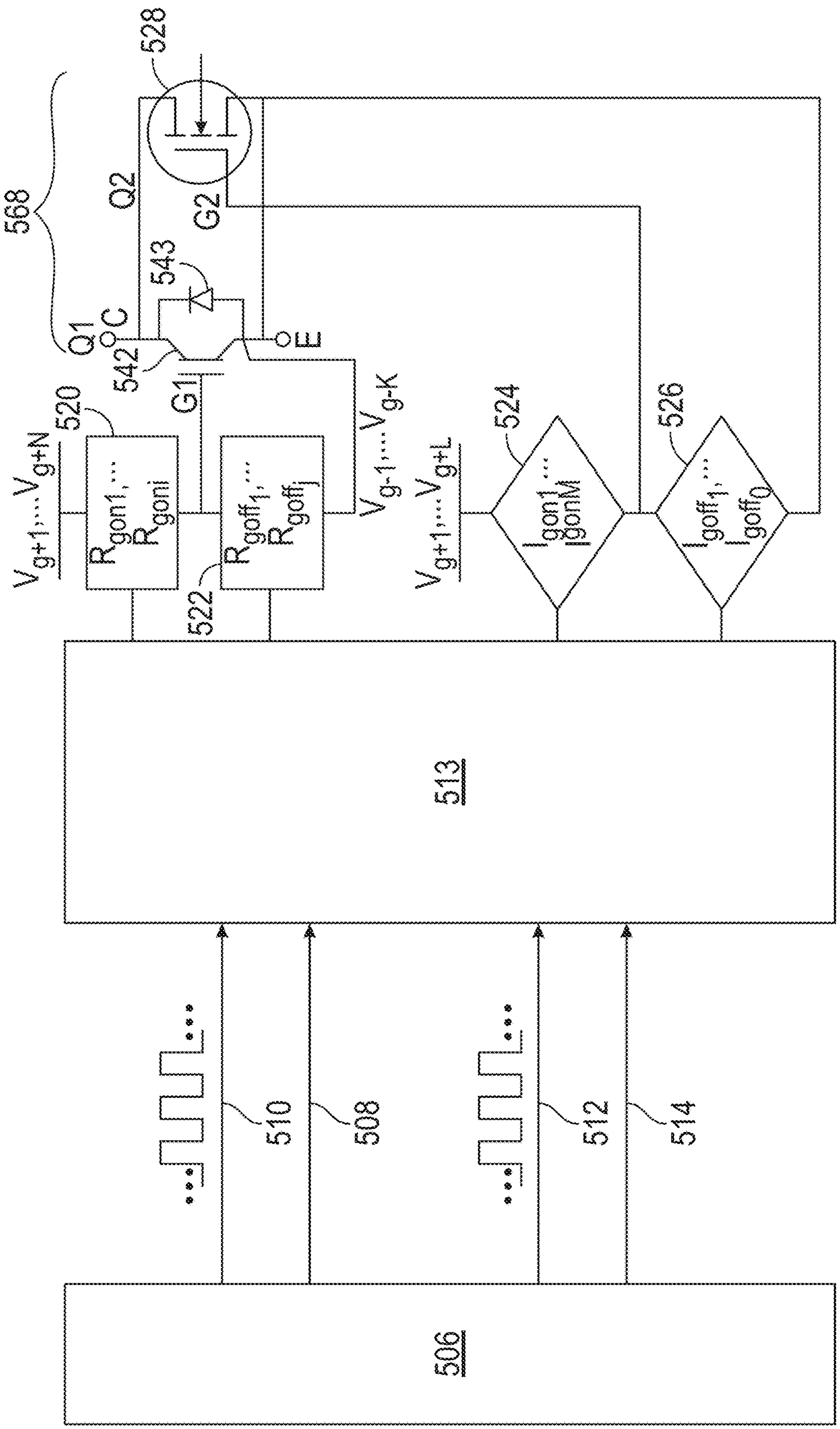
FIG. 5 is a hybrid gate driver (HGD) for reducing loss, overshoot, and the rates of change of voltage (dV/dt) and current (dI/dt) in the hybrid switches of a power module (PM).

FIG. 5 is a hybrid gate driver (HGD) for use in reducing loss, overshoot, and the rates of change of voltage (dV/dt) and current (dI/dt) in the hybrid switches of a power module (PM), in accordance with an aspect of the disclosure. The processing system includes micro-controller unit (MCU) 506, whether an autonomous integrated circuit or set thereof, or as included in an electronic control unit (ECU) of a vehicle. It should again be underscored that the principles of this disclosure are not so limited, and other networks in different implementations may benefit from the principles of this disclosure.

With reference to FIG. 5, the MCU 506 transmits PWM signals 510 and 512, with respective $I_G$, Vg+, and Vg− selection code signals 508 and $R_G$, Vg+, and Vg− selection codes 514 transmitted in parallel with PWM signals 510 and 512 along peripheral interfaces, into a hybrid gate driver 513. The gate driver 513 may be a single or multiple gate driver and may include intermediate control and switching circuitry for receiving and processing the initial PWM signals, and converting them to a specified format as needed, depending on the configuration and on the hybrid semiconductor technology or non-hybrid semiconductor technology to be driven. One example includes increasing a total voltage swing suitable for use by subsequent stages. One such stage includes volage sources with gate resistors 520 ($R_{gon1}, \ldots R_{goni}$) and 522 ($R_{goff1}, \ldots R_{goffj}$) and current sources 524 ($I_{gon1}, \ldots I_{gonM}$) and 526 ($I_{goff1}, \ldots I_{goffO}$) coupled at the output of gate driver 513 to gate G1 and emitter E of IGBT 542. IGBT 542 may be a single IGBT or multiple IGBTs in parallel with individual or paralleled gates. MOSFET 528 may be a single MOSFET or multiple MOSFETs in parallel with individual or paralleled gates. The hybrid switch 568 in this embodiment includes IGBT 542 and MOSFET 528. The gate driver 513 together with the gate resistors and the current sources coupled at its output form a hybrid gate driver (HGD). Gate resistors 520 and 522 are coupled together at gate G1. Gate resistor 520 is further coupled to node with one of the voltages $V_{g+1}, \ldots V_{g+N}$. The gate resistor 522 is coupled to the emitter E of the IGBT 542, at one of the voltages $V_{g-1}, \ldots V_{g-K}$. Current sources 524 and 526 are coupled together at G2 for sending or sinking a gate current to the MOSFET. Current source 524 is further coupled to a node at one of the voltages of $V_{g+1}, \ldots V_{g+L}$, and current source 526 is coupled to the other non-gate terminal of the MOSFET at one of the voltages $V_{g-1}, \ldots Vg_{-P}$. Gate resistors 520 and 522 and current sources 524 and 526 are shown controlling the terminals of the hybrid switch 568.

The gate driver 513 can select one of the voltages ($V_{g+1}, \ldots V_{g+N}$) with one of the gate resistors 520 ($R_{gon1}, \ldots R_{goni}$) or multiple gate resistors 520 ($R_{gon1}, \ldots R_{goni}$) arranged in parallel and put the selected combinations of voltages and gate resistors in series. This combination can then be connected to the gate G1. Each combination of voltage ($V_{g+1}, \ldots V_{g+N}$) with one or more of the gate resistors ($R_{gon1}, \ldots R_{goni}$) offers a different switching slew rate for turning on the IGBT 542. Similarly, the gate driver 513 can select one of the voltages ($V_{g-1}, \ldots V_{g-K}$) with one of the gate resistors 522 ($R_{goff1}, \ldots R_{goffj}$) or multiple gate resistors 522 ($R_{goff1}, \ldots R_{goffj}$) arranged in parallel and put the selected combinations of voltages and gate resistors in series. This combination can then be connected to the emitter E and the gate G1. Each combination of voltage ($V_{g-1}, \ldots V_{g-K}$) with one or more of gate resistors ($R_{goff1}, \ldots R_{goffj}$) offers a different switching slew rate for turning off the IGBT 542. In another example, the gate resistors 520 and 522 can be used in connection with the MOSFET 528.

The gate driver 513 can select one of the voltages ($V_{g+1}, \ldots V_{g+L}$) with one of the current sources 524 ($I_{gon1}, \ldots I_{gonM}$) or multiple current sources 524 ($I_{gon1}, \ldots I_{gonM}$) arranged in parallel and put the selected combinations of voltages and current sources in series. This combination can then be connected to the gate G2. Each combination of voltage ($V_{g+1}, \ldots V_{g+L}$) with one or more of the current sources ($I_{gon1}, \ldots I_{gonM}$) offers a different switching slew rate for turning on the MOSFET 528. Similarly, the gate driver 513 can select one of the voltages ($V_{g-1}, \ldots V_{g-P}$) with one of the current sources 526 ($I_{goff1}, \ldots I_{goffO}$) or multiple current sources 526 ($I_{goff1}, \ldots I_{goffO}$) arranged in parallel and put the selected combinations of voltages and current sources in series. This combination can then be connected to the MOSFET 528. Each combination of voltage ($V_{g-1}, \ldots V_{g-L}$) with one or more of current sources 526 ($I_{goff1}, \ldots I_{goffO}$) offers a different switching slew rate for turning off the MOSFET

528. In another example, the current sources 524 and 526 can be used in connection with the IGBT 542.

The hybrid switch 568 includes IGBT 542 and power MOSFET 528. Diode 543 is coupled between the collector C and emitter E nodes of the IGBT 542. In this configuration, gate driver 513 is merely shown as driving a single stage (hybrid switch 568) for simplicity and to avoid unduly obscuring the concepts of the disclosure. However, in other embodiments, gate driver 513 may be driving more than one stage, such as three stages in a polyphase electric motor. Nodes Q1 and Q2 are configured such that two non-gate nodes of the transistors are coupled together. Thus, the collector C of IGBT 542 is coupled directly to Q1 and Q2. Gate resistors 520 and 522 may control the voltage through gate G1 of IGBT 542. The node voltage of gate resistor 522 is the same as that of emitter E of IGBT 542, because the terminals are physically connected. The emitter is connected directly in this embodiment to the drain or source of the MOSFET 528, depending on whether the MOSFET 528 is p-type or n-type. It is noteworthy that gate current sources 524 and 526 may also be interpreted as a single current source, controlling the flow of current into and out of the gate G2 of MOSFET 528. Furthermore, the gate resistor 520 and 522 may also be interpreted as a single gate resistor, controlling the flow of charge into and out of the gate G2 of MOSFET 528.

As noted above, gate driver 513 is configured to control its output for each switch of the power module (or each die of the switch, as described below). One feature of the HGD in FIG. 5 is that the different gate resistors 520 and 522 and the current sources 524, and 526 may be supplied by different voltage sources optimal to the diverse types of semiconductor technologies in a manner that optimally reduces conduction loss and EMI. One example is the current source can provide variable gate currents to semiconductor devices that require fine control of switching slew rate while voltage source can provide stronger sinking and sourcing for semiconductor devices with larger gate capacitance. In addition, in some embodiments, current sources 524 and 526 may include one or more of transistors or circuit elements. Further, additional current sources, or current source arrays, may in some cases be deployed.

Figure 6:
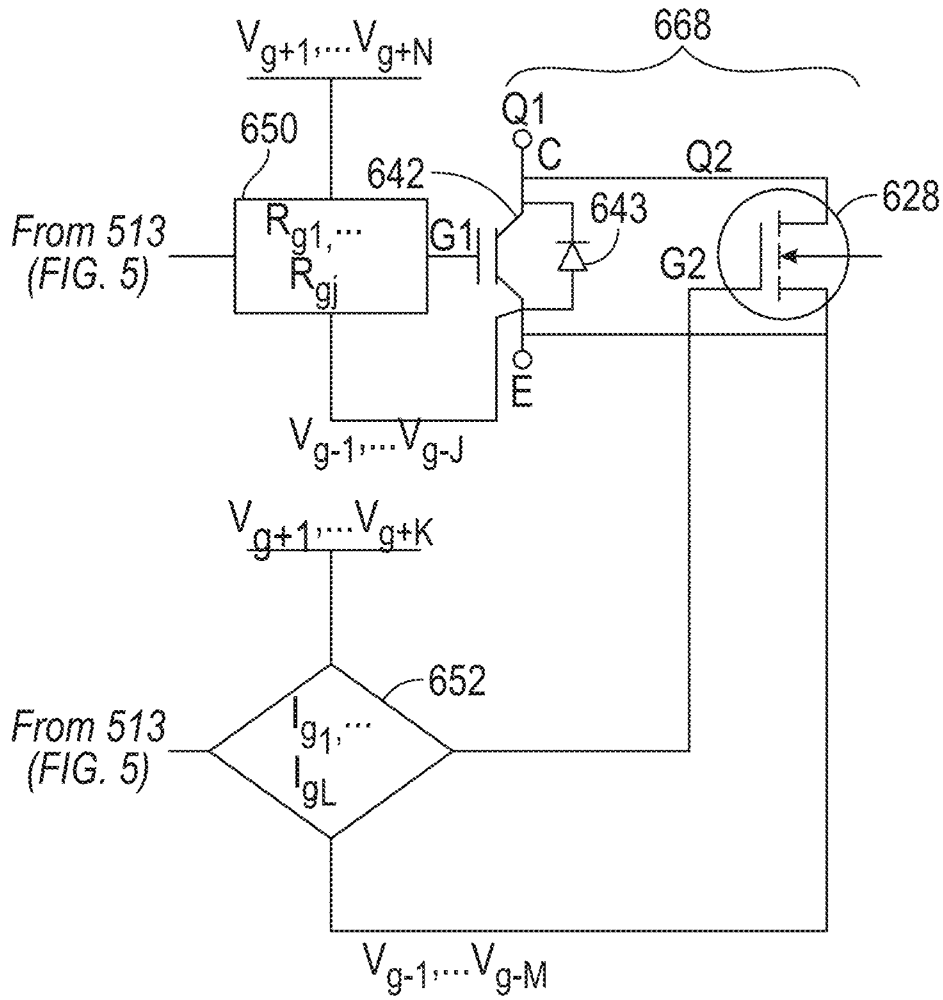
FIG. 6 is another embodiment of a HGD for controlling each die of the hybrid switch.

FIG. 6 is another embodiment a HGD for controlling the output gate voltage or output gate current for each die of the hybrid switch. The features of FIG. 6 are similar to those of FIG. 5, with the main difference being the configuration of the gate resistor 650 are used for both turn-on and turn-off and current source 652 are bidirectional current sources that can output $I_{gon}$ and sink $I_{goff}$ in this embodiment. In this embodiment, the gate driver 513 is configured to control the gate resistor 650 and the current source 652 for each physical semiconductor die of a hybrid switch 668. A gate resistor 650 is coupled to an output of gate driver 513, or a similar gate driver having two outputs. Gate resistor 650 has an output coupled to the gate of the IGBT 642, a rail coupled to a first voltage supply ($V_{g+1}, \ldots V_{g+N}$) coupled to the gate resistor 650, and a second voltage supply ($V_{g-1}, \ldots V_{g-J}$) coupled to an emitter E of the IGBT 642 for allowing the flow of voltage through the gate G1 of the IGBT 642. As before, a diode 643 is disposed between the collector C and emitter E of the IGBT 642. In this example, a current source 652 is also coupled to an output of the gate driver 513, or a similar gate driver having two outputs. The current source 652 is also coupled to a rail having a voltage of ($V_{g+1}, \ldots V_{g+K}$), and to the emitter E voltage by virtue of the emitter E being coupled to the drain or other non-gate terminal of the MOSFET 628. The gate driver may have a single or multiple gate resistors 650 and 652, each driving a single or multiple transistor die, switch, or hybrid power module.

The gate driver 513 can select one of the voltages ($V_{g+1}, \ldots V_{g+N}$) with one of the gate resistors 650 ($R_{g1}, \ldots R_{gj}$) or multiple gate resistors 650 ($R_{g1}, \ldots R_{gj}$) arranged in parallel and put the selected combinations of voltages and gate resistors in series. This combination can then be connected to the gate G1. Each combination of voltage ($V_{g+1}, \ldots V_{g+N}$) with one or more of the gate resistors ($R_{g1}, \ldots R_{gj}$) offers a different switching slew rate for turning on the IGBT 642. Similarly, the gate driver 513 can select one of the voltages ($V_{g-1}, \ldots V_{g-J}$) with one of the gate resistors 650 ($R_{g1}, \ldots R_{gj}$) or multiple gate resistors 650 ($R_{g1}, \ldots R_{gj}$) arranged in parallel and put the selected combinations of voltages and gate resistors in series. This combination can then be connected to the emitter E. Each combination of voltage ($V_{g-1}, \ldots V_{g-J}$) with one or more of gate resistors 650 ($R_{g1}, \ldots R_{gj}$) offers a different switching slew rate for turning off the IGBT 642. In another example, the gate resistors 650 can be used in connection with the MOSFET 628.

The gate driver 513 can select one of the voltages ($V_{g+1}, \ldots V_{g+K}$) with one of the current sources 652 ($I_{g1}, \ldots I_{gM}$) or multiple current sources 652 ($I_{g1}, \ldots I_{gL}$) arranged in parallel and put the selected combinations of voltages and current sources in series. This combination can then be connected to the gate G2. Each combination of voltage ($V_{g+1}, \ldots V_{g+K}$) with one or more of the current sources ($I_{g1}, \ldots I_{gL}$) offers a different switching slew rate for turning on the MOSFET 628. Similarly, the gate driver 513 can select one of the voltages ($V_{g-1}, \ldots V_{g-M}$) with one of the current sources 652 ($I_{g1}, \ldots I_{gL}$) or multiple current sources 652 ($I_{g1}, \ldots I_{gL}$) arranged in parallel and put the selected combinations of voltages and current sources in series. This combination can then be connected to the MOSFET 628. Each combination of voltage ($V_{g-1}, \ldots V_{g-M}$) with one or more of current sources 652 ($I_{g1}, \ldots I_{gL}$) offers a different switching slew rate for turning off the MOSFET 628. In another example, the current source 652 can be used in connection with the IGBT 642.

With continued reference to FIG. 6, the collector is coupled to the drain Q2 of MOSFET 628, or a non-gate terminal of the MOSFET. Current source 652 is thereupon coupled to gate G2 of the power MOSFET. As in the embodiment of FIG. 5, the HGD 513 of FIG. 6 utilizes VSs and CSs to allow variable output or sinking currents to the gates of the individual switches, and in other embodiments, to their dies, or a combination of the hybrid PM. The configurations in FIGS. 5 and 6 allow the PM to control SR in or near real time with precision. For example, unlike existing implementations where the SR is a single value during a single switching event (e.g., a switch-on or a switch-off), the HGDs described above are configured to use different SR values for a single switching event that optimize loss, dV/dt, common mode current, bearing current, overshoot, and ringing that otherwise is left unaccounted for in the hybrid PM.

It should be noted that, in considering a transistor layout of the circuit described in FIG. 6, each die may have its own voltage or current source such that different dies may advantageously be controlled individually to accommodate different switching speeds. Similar to FIG. 5, the gate resistor 650 and current source 652 of FIG. 6 may include one, or a plurality of, transistors or other circuit elements. Further, additional current sources, or current source arrays, may in some cases be deployed.

The switching of a hybrid switch according to an exemplary embodiment is now described.

Figure 7A:
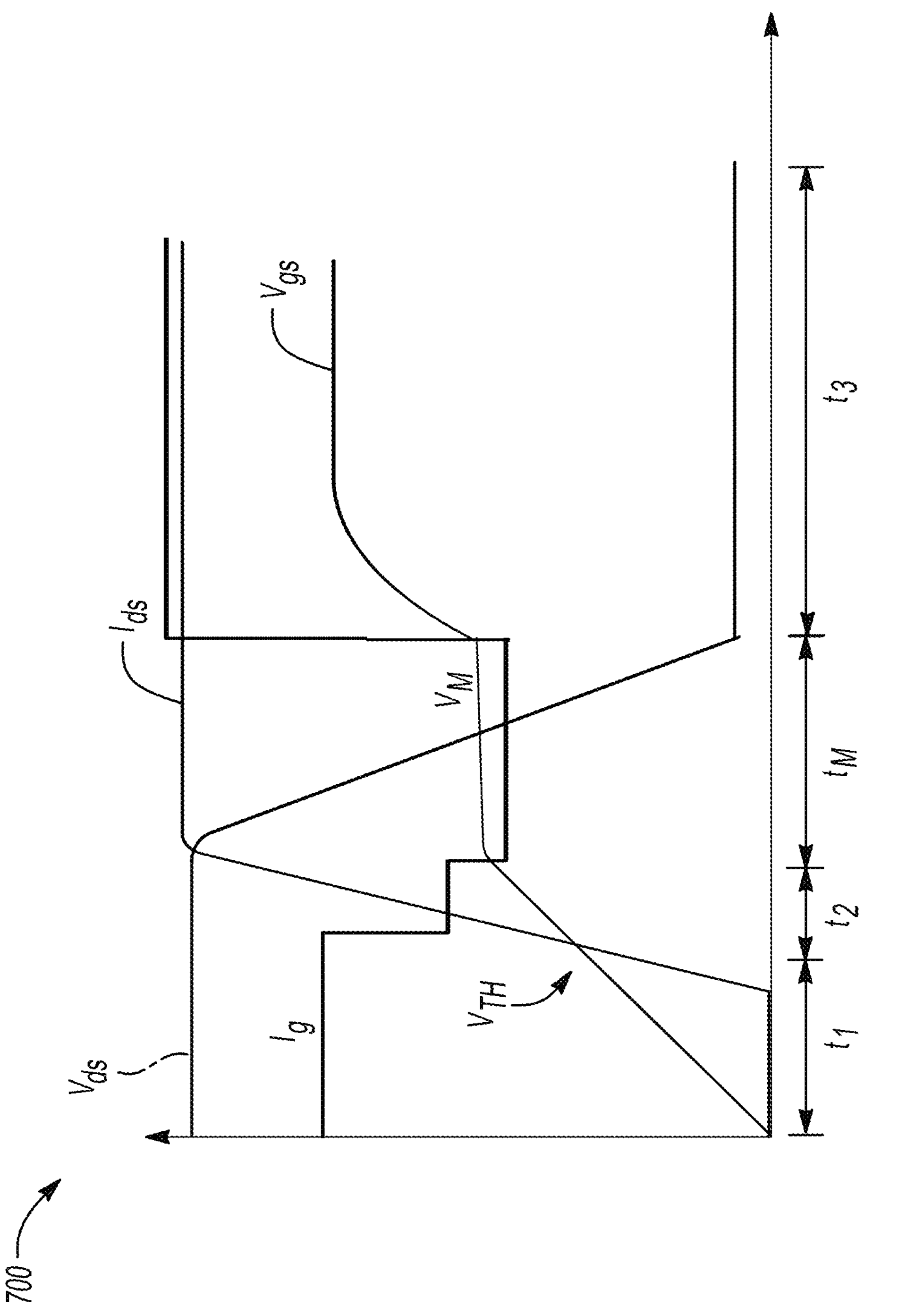
FIG. 7A is a timing diagram illustrating a series of waveforms present during a turning-on of a hybrid switch due to waveforms from a PWM generator and an output gate current of a hybrid switch in the PM and to regulate the switching speed, loss and overshoot.

FIG. 7A is a timing diagram 700 illustrating a series of waveforms present during a turning-on of a power switch due to waveforms from a PWM generator and an output gate current of a hybrid switch in the PM and to regulate the switching speed, loss and overshoot. In FIG. 7A, one waveform is shown which corresponds to $I_g$. In one embodiment, a first set of current sources may source and sink a gate current into/from a first power transistor (or group thereof) of one semiconductor type. In practice, however, different numbers of current sources may be used. More than two semiconductor technologies may also be used to implement a hybrid switch. As an example, three or more current sources (or sets of current sources) producing three or more distinct, bi-directional gate currents may be used in a power inverter module (PIM) to drive a polyphase motor. For clarity and to avoid unduly obscuring the concepts of the disclosure, two current sources are used.

Referring back to FIG. 5, it should be noted that the circuit elements in current source 524 and 526 may be characterized by one of the waveforms of FIG. 7A. With brief reference to FIG. 5 again, because the emitter (E) of the Si IGBT 542 is coupled directly to the source of SiC MOSFET 528, and because the collector (C) of the Si IGBT 542 is coupled directly to the drain of SiC MOSFET 528, the voltage across the Si IGBT 542 and the SiC MOSFET 528 of the hybrid switch represents a single quantity. That is to say, in the example case of a hybrid gate driver, the gate driver directly outputs a voltage to the Si IGBT 542 and a current (or receives a current) to the MOSFET 528, but the ultimate result is that the MOSFET 528 also experiences a voltage. In an exemplary embodiment, a turning on of the switch is illustrated. During a first time period $t_1$ in FIG. 7A, the MCU is configured to apply a high switching speed (e.g., FIG. 5) by applying a high gate current $I_{gon}$, or the HGD use the voltage source instead of the current source to source the gate, in this example during time period $t_1$ and slightly beyond time period $t_1$ until the gate-to-source voltage reaches the threshold voltage $V_{TH}$. Meanwhile, the $V_{gs}$ value increases quickly, surpassing the threshold voltage $V_{TH}$ specific to the transistor and consequently, right after $V_{TH}$ is passed, the drain current through the transistor shoots up quickly. This high SR of the gate current accelerates the rise of $I_{ds}$ to reduce switching loss and deadtime, e.g. to minimize the losses that occur during the time period when the transistor is transitioning between fully-on and fully-off.

During a time period $t_2$ slightly after $t_1$, the gate current $I_g$ is quickly dropped to an intermediate value to reduce the switching speed and the rate of change $dI/dt=dI_{DS}/dt=dI_{CE}/dt$ of the hybrid switch (note again that in the circuits of FIGS. 5 and 7A, the collector C and emitter E of the IGBT are coupled, respectively, to the drain and source of the MOSFET). During a time period of $t_M$, slightly after $t_2$ where the gate current $I_g$ has been quickly dropped to the intermediate value, the switching speed and the rate of change $dV/dt=dV_{DS}/dt=dV_{CE}/dt$ of the hybrid switch is likewise reduced (note again that in the circuits of FIGS. 5 and 6, the collector C and emitter E of the IGBT 642 are coupled, respectively, to the source and drain of the MOSFET 628). These criteria, in turn, reduce undesirable attributes including overshoot and ringing in the drain current and voltage of the power switch. It is noteworthy that the gate current $I_g$ may be further modified, and combinations of the current source and voltage source of the HGD can be used and switched between, to apply different switching speeds and with less or more time-period slots based on the gate current amplitude, the rate of change (dI/dt) of the gate or the drain-source current, and the rate of change (dV/dt) as identified in the example above.

During the time period $t_M$, the slope of $V_{gs}$ is also reduced to correspond to the Miller plateau $V_M$. With the gate current at another intermediate value during the latter portion of time period $t_M$, switching speeds are reduced, as noted, due to the lower values of $V_{gs}$ and $I_g$. Further optimizations are available to reduce deadtime, loss, and overshoots, in other examples, such as applying different switching speeds based on the amplitude of $I_g$, and the SRs of $I_g$ and $V_{gs}$.

Beginning at approximately the third time period $t_3$ and extending thereafter, a high to a maximum gate current $I_g$ is applied, or the HGD switches from using the current source to the voltage source to source the gate, until the value of $V_{gs}$ reaches the nominal turn-on voltage for each different semiconductor power switch, respectively. It is noteworthy that, during the time period subsequent to time $t_3$, different switching speeds may be optimized based on the amplitude of the gate current as well as the rates of change $dI/dt=I_{DS}/dt$ and dV/dt and with less or more time-period slots.

In FIG. 7A, the overall voltage drop of $V_{ds}$ may be 400 volts or more, depending on the application. Once the switch is turned on, the current flowing through the transistor increases to provide the needed power, e.g., AC power, to the hybrid switch.

In should be underscored that the principles of the disclosure equally apply to the switching off the hybrid switch. In addition, one or more gate resistors or gate currents may be used to optimize a PM or PIM. While one example is shown, a different number of gate resistors and gate currents may be used to drive a different device. Two or more sets of gate resistors or gate currents (or some multiple of three), for example, may be hybrid switches that drive a three-phase motor.

Variable slew rates SR control to turn the switch off in an optimal manner is essentially a reverse process in the simplified embodiments of FIGS. 5 and 6. In an example that mirrors the circuit described above during a time the circuit is driving a hybrid switch in the ON-state and is about to transition to the OFF-state, a plurality of input ports for receiving pulse-width-modulation (PWM) control signals may be transmitted from a processing system to optimally cause the transition of the hybrid switch to the OFF-state. For example, during a first off-period in switching a hybrid switch from its ON-state to OFF-state, a high switching speed is applied by using a high gate current (in the opposite direction from turning ON the hybrid switch) to reduce delay in the total switching operation. During a second off-time between a transition from the first turn-off period and a second turn-off period, the circuit reduces the switching speed by decreasing $I_G$ to again reduce dV/dt, and overshoot and ringing phenomena. In various embodiments, the PWM controller may be set up for further optimizations, applying different switching speeds with less or more time-period slots based on the current amplitude, dI/dt, and dV/dt. These embodiments may vary depending on the criteria including the impedance values at various stages of the circuit, the efficiencies of the circuit elements, and the like. Thereupon, during a third period, the circuit may apply a high $I_G$ to accelerate the reduction of the switch resistance, and thereby minimize switching loss until $V_{gs}$ is off.

Referring back to FIG. 5 and FIG. 7A, it becomes apparent that the gate driver 513, the gate resistors 520 and 522, and the current sources 524 and 526 allow the switches to dump or sink different amplitudes of gate current ($I_G$) into the larger transistor. The timing diagram of FIG. 7A represents a turn-on event for the hybrid switch. A turn-off event may be illustrated such that, for a generally symmetrical waveform, the signals of FIG. 7A may be reversed in time and then shaped similarly, with down waveforms going up and vice versa.

It should be noted that for purposes of this disclosure, describing a "high", a "higher", a "low, or a "lower" voltage at the terminals of a circuit element, or also reading a value of a current, resistance, etc. as "high" the magnitude of this value is usually determined with respect to the current and voltage ranges as defined by the connected circuit elements, or based on average voltage, current or resistance ranges. They also may depend on the DC power supply, in addition to the internal value of the threshold voltage of a transistor. Thus a "high" gate current may be that of some quantity consistent with the upper or higher ratings of the particular circuit elements. Applying a high voltage or current, or a low voltage or current, will be readily apparent to those in the art upon understanding the high and low values that are to be expected in a given circuit element for the application at issue. For instance, a high $V_{ds}$ may mean that the voltage across the non-gate terminals of the transistor is at or near its highest value corresponding to an OFF-state of the switch, whereas a low $V_{ds}$ may mean the same $V_{ds}$ is at or near zero volts. The fomer case may involve a low $I_{ds}$ that is closer to zero in a specified region, and the latter may mean that the $I_{ds}$ is travelling at or near its maximum value. Process corners, temperature variations, and rail-to-rail DC voltages may also be relevant in determining which voltages or currents or high, and which are low.

Figure 7B:
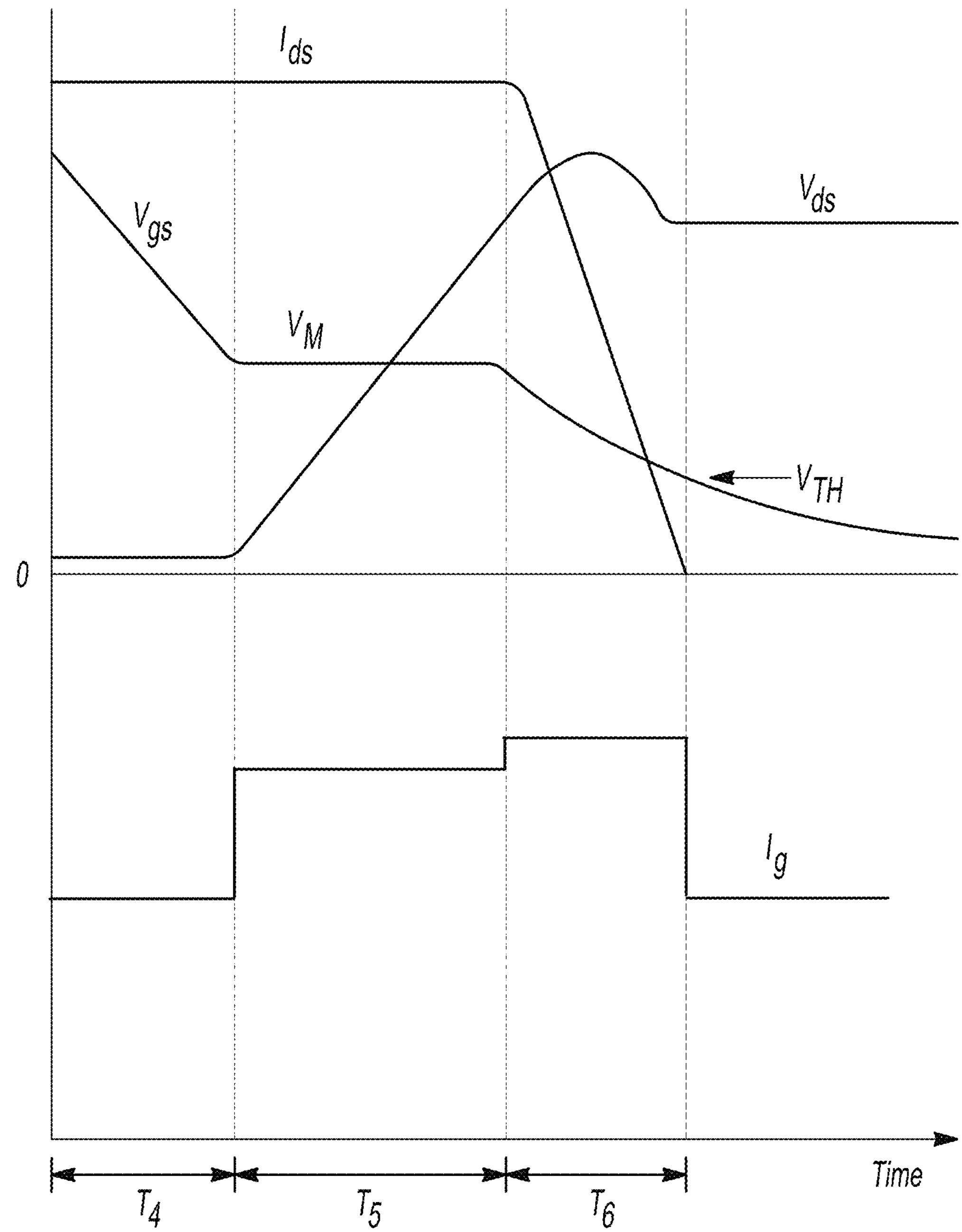
FIG. 7B is a timing diagram illustrating waveforms present during the turning-off of a hybrid switch with the HGD.

FIG. 7B is a timing diagram illustrating waveforms present during the turning-off of a hybrid switch due to a HGD. The figure is similar to that of FIG. 7A but with the following exceptions. First, while FIG. 7A represents an example turning-on phase of a hybrid switch (such as a switch having one or more transistors with two different semiconductor technologies), in FIG. 7B, only one gate current is driven here for simplicity. In practical applications, such as driving an AC motor, several hybrid switches in a PIM may be used. Referring to FIG. 7B, the drain current $I_{ds}$ is shown at its maximum value during time period $T_4$, because the switch is open. Meanwhile during time period $T_4$, the gate current $I_g$ is at a high (negative) value along with a rapidly decreasing value of $V_{gs}$ during time period $T_4$ to reduce the delay and deadtime. The gate-to-source voltage progressively decreases until it reaches the Miller plateau, denoted here as the flat voltage $V_M$ during the time period $T_5$. Shortly after the beginning of time period $T_5$, the magnitude of $I_g$ is quickly reduced in value to its second lowest of the two intermediate values. This action reduces the switching speed by lowering $V_{gs}$ and $I_g$, thereby reducing dV/dt, and overshoot and ringing phenomena. Just as with the turning-on phase of FIG. 7A, the waveforms may further be optimized using different switching speeds based on the amplitude of $I_g$, and the slew rates dI/dt and dV/dt. Meanwhile, at the end of time period $T_5$, the Miller plateau ends and, during time period $T_6$, the magnitude of $I_g$ increases, and $V_{gs}$ returns to decreasing at a higher SR, but at a lesser SR than that of time period $T_4$ due to the lesser magnitude of $I_g$ in time period $T_6$, thereby reducing dI/dt. Meanwhile, as $V_{gs}$ crosses the threshold voltage $V_{TH}$, the transistor turns off and the drain current goes to zero Amps at the end of time period $T_6$. After time period $T_6$, a higher value of negative gate current $I_g$ is applied and maintained to accelerate $dV_D/dt$ and $dV_{GS}/dt$, which, in turn, minimizes the switching loss until $V_{gs}$ turns off. After the transistor is off and $V_{ds}$ reaches its upper equilibrium value, the gate current is quickly decreased in negative magnitude back to zero, and the values of $V_{gs}$ are maintained at the nominal turn-off voltages for the different semiconductor power switches, respectively.

Figure 8A:
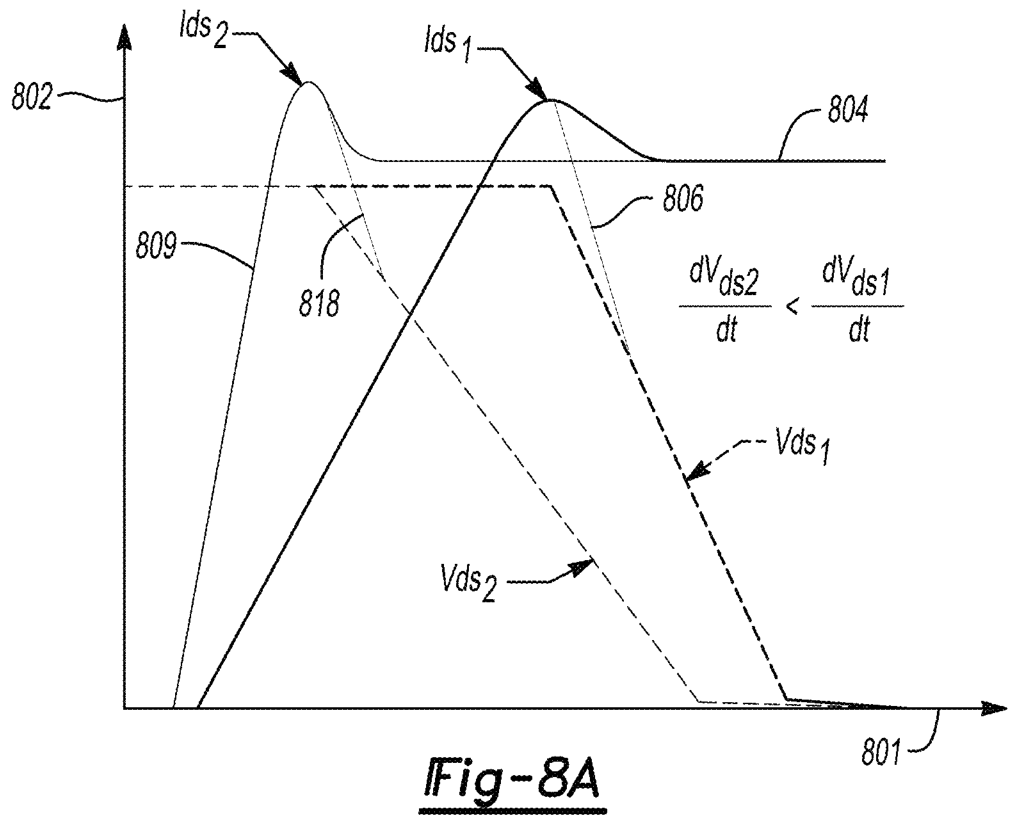
FIG. 8A is a timing diagram illustrating the voltages and currents in switching on a hybrid switch, with and without using dynamic slew change (DSC).

FIG. 8A is a timing diagram illustrating the voltages and currents in switching ON a power switch, with and without using dynamic slew change (DSC). The horizontal axis 801 is in units of time. The vertical axis 802 is in units of amplitude, i.e., voltage for V-labeled waveforms and amperes (amps) for I-labeled waveforms. FIG. 8A, as noted, depicts turning on one of the switches. Referring initially to scenario 1 (without slew control), the gate driver integrated circuit turns on the transistors by switching the gate-to-source voltages to values that exceed the threshold voltage sufficient to allow the current $I_{ds1}$ to reach a maximum value. It is noteworthy that high frequency components such as ringing and EMI are omitted for the purposes of simplifying the presentation, at least because they are unlikely to have a material effect on the results that are the focus of this material. As the current $I_{ds1}$ increases in response in a manner proportional to that of the SR of the gate-source voltage, the voltage across the drain and source ($V_{ds1}$) eventually decreases from its fixed value to a value close to zero (because the transistors are not ideal switches). The rate of change of $I_{ds1}$ is high. Both overshoot and high values of SR (e.g., dV/dt, dI/dt) contribute to (i) higher electrical stress on power switches, leading to physical damage, (ii) higher ringing, and higher conductive and radiated EMI, and (iii) higher motor terminal voltage overshoot (partial charge inception voltage or PDIV) and bearing current, each of which may lead to various types of damage. The overshoot of $I_{ds1}$ above its steady-state value relative to 802 is apparent. Because $I_{ds1}$ extends above its nominal maximum value and continues to increase during the overshoot, the switch is still experiencing losses. Meanwhile, as the gate-source voltage (omitted) continues to increase at a fixed slew rate. To estimate the additional switching loss caused by the overshoot, a line 806 is drawn tangential to the apex of overshoot of $I_{ds1}$. The hypothetical line 806, which begins at the apex of the overshoot of $I_{ds1}$ and continues downward until it reaches $V_{ds1}$, represents the approximate area under the curve under $I_{ds1}$ between when $I_{ds}$ begins at 0 and $V_{ds1}$ ends at 0 and including the apex from the overshoot, which is the estimated total switching loss ("$\text{Loss}_1$") by virtue of being limited to a single SR.

Referring again to FIG. 8A, but this time employing an example HGD using a dynamic slew rate, the switching speed is initially applied such that the current $I_{ds2}$ through the transistor is accelerated at the region 809 adjacent the $_{dsS2}$ waveform, producing a steep slope. However, with DSC applied, the switching speed is reduced by reducing $I_G$ (omitted for clarity) beginning about when the drain current overshoots the nominal maximum value of $I_{ds2}$ (at about line 804) or the $V_{ds}$ starts to reduce. As noted above, the reduced switching speed caused by the lower gate-source current values reduces the SR of $V_{ds2}$ (e.g., $dV_{ds2}/dt$). This SR reduction in $V_{ds2}$, which was not present in $V_{ds1}$, means that the slope of $V_{ds2}$ as it returns to a nominal value close to 0 is smaller than the corresponding slope of $V_{DS1}$ as it returns to approximately zero. That is to say, $dV_{ds2}/dt<dV_{ds1}/dt$. Thus, using the HGD with the same power switch results in reduced ringing, a decreased time in overshoot, and common mode and bearing currents.

To estimate the additional switching loss caused by the overshoot, a line 818 is drawn to extend to the apex of overshoot of $I_{ds1}$. The hypothetical line 806, which begins at the apex of the overshoot of $I_{ds1}$ and continues downward until it reaches $V_{ds1}$, represents the approximate area under the curve between $V_{ds1}=0$ and $V_{ds1}$ ending at zero, and including the apex, which is the estimated conduction loss ("$Loss_2$") by virtue of using a HGD. From the graph it is evident that $Loss_2 < Loss_1$, which in turn means that overall higher performance with fewer switching losses may be achieved using the principles of the present disclosure.

Figure 8B:
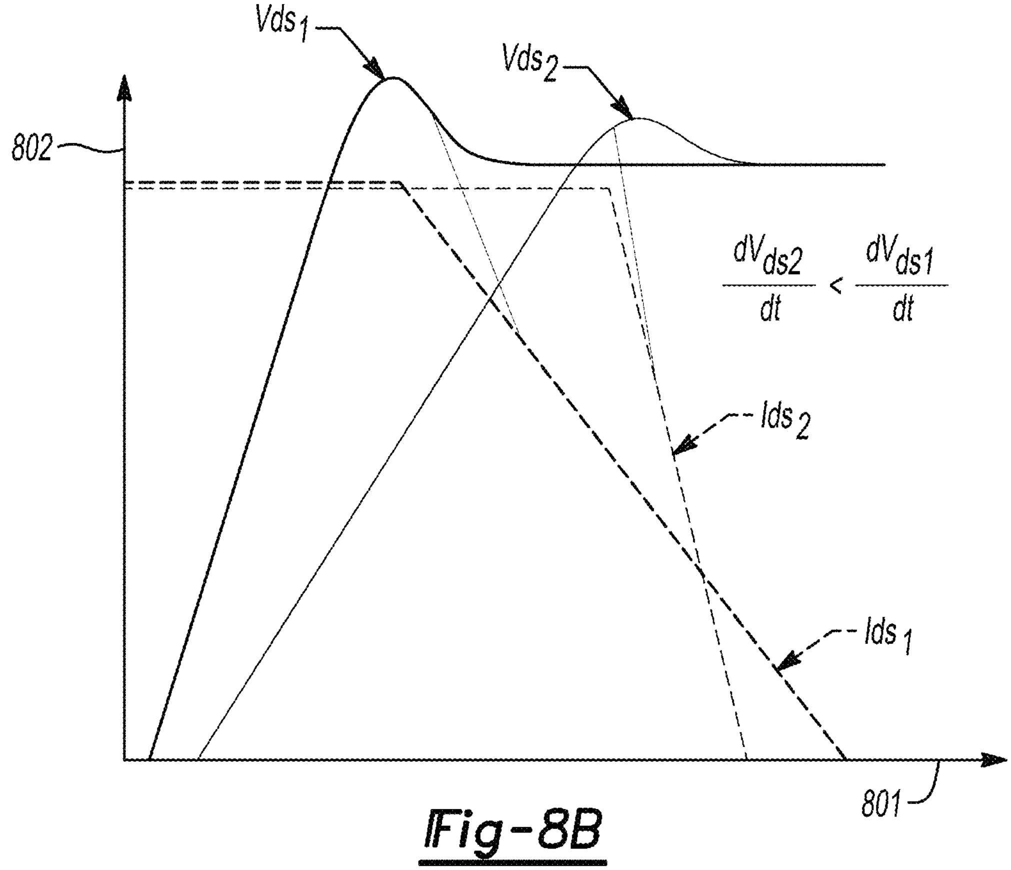
FIG. 8B is a timing diagram illustrating the voltages and currents in switching off a hybrid switch, with and without using dynamic slew change (DSC).

FIG. 8B is a timing diagram that is similar conceptually to FIG. 8A, but that instead illustrates the voltages and currents in switching OFF of a power switch, with and without using dynamic slew change (DSC). Referring initially to the case where a single SR is available and the transistor is in an "on" position, a driver may reduce $V_{gs}$ which results in $V_{ds1}$ across the transistor increasing. This causes the voltage $V_{ds1}$ to rise back from zero to its overshoot peak, prior to finally equalizing at its nominal value. As $V_{gs}$ nears the threshold voltage, $I_{ds1}$ proceeds to decrease at a fast rate until the gate threshold is crossed and a drain current value of zero is reached. Referring next to the second case where a HGD is used, and applying a similar analysis as in FIG. 8A, the result is analogous; the use of a modified SR creates less overshoot, ringing, and DMI, and a lower overall switching loss.

One issue that has been encountered with respect to certain semiconductor technologies is the difference in sizes and/or compositions of the transistors. More generally, one of the two or more switches in a hybrid switch may have a much smaller input capacitance than the others, leading to a much faster ON state for the device with the small capacitance. Using the example where the hybrid switch includes a SiC MOSFET and a Si IGBT, the former device is much smaller than that of the latter device. The much smaller gate of the SiC MOSFET relative to that of the Si IGBT means that the SiC MOSFET has a much smaller input capacitance. This discrepancy results in a much faster turning ON of the SiC MOSFET than the Si IGBT, resulting in overcurrent and other potentially harmful electrical artifacts.

Accordingly, in another aspect of the disclosure, the HGD (FIGS. 5 and 6) is configured to increase the turning-on speed of the IGBT and to optimize zero voltage switching (ZVS) by controlling the output gate current, and to optimize the turning on of the hybrid switch with or without using PWM delay control (e.g., delay PWM signals to faster semiconductor to help equalize switching on or off timings).

These actions may be summed more compactly as follows:

Optimize the IGBT's loss, overshoot, and dI/dt using dynamic gate current control while speeding up the switching of the IGBT.

Optionally reduce slew rate of SiC MOSFET to comport with that of Si IGBT, which increases loss.

ZVS is a technique involving switching a semiconductor on or off with minimal switching stresses and loss. Using ZVS, when a MOSFET is switched from one state to another, the controller or MCU waits until the driving voltage drops to zero before the MOSFET is switched. ZVS is the concept that, because Power=Voltage×Current, when the voltage is kept at ground, no power loss is experienced regardless of the value of the current. ZVS may apply in the context of silicon or wide-bandgap (WBG)-based semiconductors. WBG semiconductors have a larger bandgap than some semiconductors. The bandgap is the energy difference in a semiconductor between the top of the valence band and the bottom of the conduction band. This larger energy difference permits WBG-based power transistors to operate at higher voltages using higher frequencies. Examples of WBG semiconductors include gallium nitride (GaN) and silicon carbide (SiC). WBG semiconductors in power-based applications include increased efficiency and power density. Caution should be taken, however, because excessive values of dV/dt may induce a high voltage across the rotor/stator insulation. Accordingly, its value should be controlled so as not to damage structures in the motor. At the same time, however, it is beneficial to increase the initial switching speed with as fast an adjustment current as is practical to maximize the power transferred to the motor. This stems from the relationship power (P)=VI. Because current is proportional to the area through which the moving charge passes, a tradeoff is present in that one limiting factor to the maximum delivered power is the maximum size of the semiconductor transistors. Sophisticated control of switching speed enabled by the HGD may enable ZVS while mitigating the tradeoffs.

PWM delay control may also beneficially be used to delay the update of PWM outputs to the faster transistor. This enables the slower transistor to initiate its turning-on earlier. To this end, reference is made back to FIG. 4B, which include respective timing diagrams of the switching waveform of a silicon insulated-gate bipolar transistor (Si IGBT) pulse 430*a* and that of a silicon-carbide metal oxide semiconductor field effect transistor (SiC MOSFET) pulse 430*b*. As noted above, the HGD in cooperation with the MCU 506 (FIG. 5) may employ dynamic gate current manipulation with PWM delays $t_1$ and $t_2$ as needed to correct for these differences in input capacitance.

Another problem that has arisen is the fact that the WBG (typically the smaller die) may be packaged with the IGBT which is larger, would cause a non-optimal power commutation loop size for the WBG device and that causes the concerns of larger commutation loop specifically for the WBG device. To counter this phenomenon, in accordance with yet another aspect of the disclosure, the HGD may increase the turning on and turning off speeds of the slower power transistor or reduce the turning on and turning off speeds of the faster transistor. The HGD may accomplish these objectives by controlling its output gate current to the faster transistor and optimizing it using the PWM delay. These actions beneficially may optimize the IGBT's overshoot, ringing, dV/t and dI/dt using the dynamic gate current control while also increasing the speed of the switching. In an optional embodiment, the HGD may reduce the slew rate of the SiC gate, or the transistor with a larger loop size, although doing so increases the switching loss.

Yet another problem with some gate drive hardware is the perceptibility of the Miller effect, in this example that of the Si IGBT. To this end, there exists a region in which the gate-to-source voltage reaches the gate-plateau voltage $V_{GP}$, also called the Miller voltage. This voltage, which describes a region of the semiconductor, comports with the OFF region. During this so-called second turn-off time, $V_{GP}$ will have a zero or near zero slope. In some gate drivers, the Miller effect of one of the semiconductors (e.g., Si IGBT) becomes noticeable. For example, the SiC's high dV/dt will induce the Miller current to the Si IGBT and potentially result in a false turn on of the transistor, resulting in an IGBT tail current or short circuit. The use of PWM control, by itself, cannot provide a full ZVS to correct this problem, resulting in increased conduction losses, or short circuit device damage.

Accordingly, in another aspect of the disclosure, the HGD may lower the gate current $I_G$ to the SiC during the dV/dt stage of the turning-off process to reduce the Miller current into the IGBT. Benefits of this dynamic gate current control include optimizing the loss increment, enabling the saving of the Miller clamp circuit, and enabling reduction of the negative voltage, the latter of which results in savings of switching loss.

In a further aspect of the disclosure, the HGD may be configured to control SRs to optimize reverse recovery current. It is noteworthy that, to the extent the MCU, processor or processing system in each aspect of this disclosure includes hardware functionality or code that may participate in directing the HGD to perform its stated objective, the HGD for purposes of this disclosure includes that hardware functionality of, or code executing within, the MCU, processor, or processing system.

Reverse recovery current in a power transistor results from the movement of reverse charge carriers. For example, when a MOSFET is switched OFF, the forward current decreases, and remaining charges flow in reverse over the body. Reverse recovery current thus includes the dissipated power of a switching transistor, which becomes increasingly pronounced with increasing switching speeds and power. Since P=V×I, faster switching speeds indicate that the relative amount of power dissipated in the reverse direction also increases. Due in part to its device structure and semiconductor characteristics of the IGBT over the MOSFET, the IGBT has a much higher reverse recovery current, causing overshoots, EMI, and ringing. Due to higher parasitic inductance of the IGBT cover the MOSFET, the inductive voltage drop [ΔV=L×(dI/dt)] is increased, resulting in delayed reverse recovery current peaks and additional voltage drops at the IGBT, resulting in increased switching losses.

To address this shortcoming, the HGD may be configured to control dI/dt to reduce reverse recovery, improving overshoot, and enabling higher switching speeds. For example, in various embodiments, the HGD is configured to reduce the gate current to the SiC (i.e., on the low side, 409) gate during the dI/dt stage of the turning on phase to reduce the reverse recovery current from the IGBT of the other side (i.e., the high side, 411, 415 and D3). Reducing the reverse recovery voltage ($V_{RR}$) optimizes the loss increment, thereby enabling higher switching speeds. In addition, reducing $V_{RR}$ enables the ability to use a Miller clamp circuit in some embodiments, or not have them in others as is suitable for the design. The reduced $V_{RR}$ also may reduce the negative voltage, the latter of which reduces switching loss.

Figure 9:
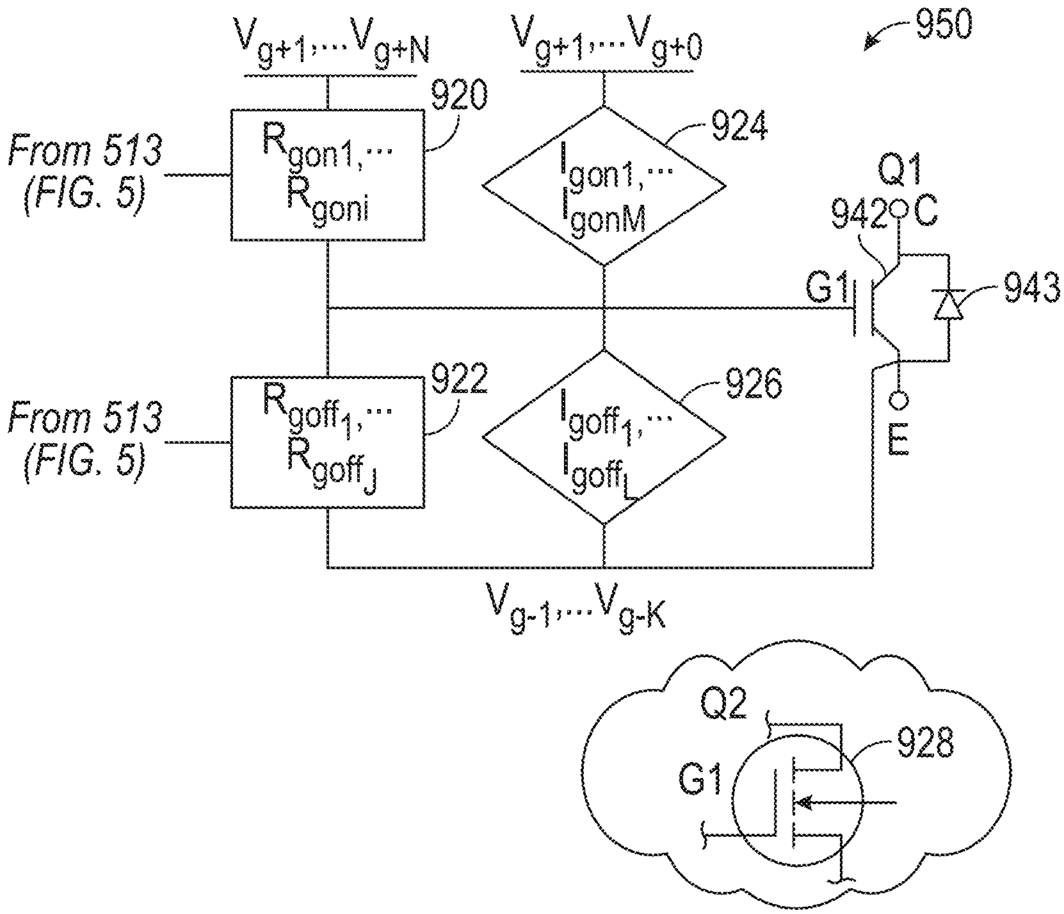
FIG. 9 is another example hybrid gate driver (HGD) for reducing loss, overshoot, and the rates of change of voltage (dV/dt) and current (dI/dt) in the hybrid switches of a power module (PM).

FIG. 9 is an example switch having a single transistor technology used in connection with gate resistors 920 and 922 and current sources 924 and 926. While the illustrated utilizes a Si IGBT 943, a MOSFET 928 can also be used in place of the Si IGBT 943.

The features of FIG. 9 are similar to those of FIG. 5, with the main difference being a single transistor being connected to voltage sources with gate resistors 920 and 922 and current sources 924 and 926. In this embodiment, the gate driver 513 is configured to control the gate resistors 920 and 922 and the current source 924 and 926 for a single physical semiconductor of a switch 950. For example, the HGD can include one of the voltage sources ($V_{g+1}, \ldots V_{g+N}$ and $V_{g-1}, \ldots V_{g-K}$) or multiple voltage sources ($V_{g+1}, \ldots V_{g+N}$ and $V_{g-1}, \ldots V_{g-K}$) and one of the current sources ($I_{gon1}, \ldots I_{gonM}$ and $I_{goff1}, \ldots I_{goffL}$) or multiple current sources ($I_{gon1}, \ldots I_{gonM}$ and $I_{goff1}, \ldots I_{goffL}$), i.e. various combinations can be made between the voltage sources and the current sources. One feature of this disclosure is to have at least one voltage source on one side and at least one current source on the other side.

The gate resistors 920 ($R_{gon1}, \ldots R_{goni}$) and 922 ($R_{goff1}, \ldots R_{goffJ}$) and current sources 924 ($I_{gon1}, \ldots I_{gonM}$) and 926 ($I_{goff1}, \ldots I_{goffL}$) are coupled at the output of gate driver 513 to gate G1 and emitter E of IGBT 942. The gate driver 513 together with the gate resistors 920 and 922 and the current sources 924 and 926 coupled at its output form a hybrid gate driver (HGD). Gate resistor 920 is further coupled to node with one of the voltages $V_{g+1}, \ldots V_{g+N}$. The gate resistor 922 is coupled to the emitter E of the IGBT 942, at one of the voltages $V_{g-1}, \ldots V_{g-K}$. Current sources 924 and 926 are coupled together at G1. Current source 924 is further coupled to a node at one of the voltages of $V_{g+1}, \ldots V_{g+O}$, and current source 926 is coupled to the other non-gate terminal of the IGBT 942 at one of the voltages $V_{g-1}, \ldots V_{g-K}$. Gate resistors 920 and 922 and current sources 924 and 926 are shown controlling the terminals of the IGBT 942, but can also be used to control a MOSFET 928. In the illustrated example, Diode 943 is coupled between the collector C and emitter E nodes of the IGBT 942.

With continued reference to FIG. 9, the gate driver 513 can select one of the voltages ($V_{g+1}, \ldots V_{g+N}$) with one of the gate resistors 920 ($R_{gon1}, \ldots R_{goni}$) or multiple gate resistors 920 ($R_{gon1}, \ldots R_{goni}$) arranged in parallel and put the selected combinations of voltages and gate resistors in series. This combination can then be connected to the gate G1. Each combination of voltage ($V_{g+1}, \ldots V_{g+N}$) with one or more of the gate resistors ($R_{gon1}, \ldots R_{goni}$) offers a different switching slew rate for turning on the IGBT 942. Similarly, the gate driver 513 can select one of the voltages ($V_{g-1}, \ldots V_{g-K}$) with one of the gate resistors 922 ($R_{goff1}, \ldots R_{goffJ}$) or multiple gate resistors 922 ($R_{goff1}, \ldots R_{goffJ}$) arranged in parallel and put the selected combinations of voltages and gate resistors in series. This combination can then be connected to the emitter E. Each combination of voltage ($V_{g-1}, \ldots V_{g-K}$) with one or more of gate resistors ($R_{goff1}, \ldots R_{goffj}$) offers a different switching slew rate for turning off the IGBT 942. In another example, the gate resistors 920 and 922 can be used in connection with a MOSFET 928.

The gate driver 513 can select one of the voltages (Vg+1, . . . Vg+O) with one of the current sources 924 ($I_{gon1}, \ldots I_{gonM}$) or multiple current sources 924 ($I_{gon1}, \ldots I_{gonM}$) arranged in parallel and put the selected combinations of voltages and current sources in series. This combination can then be connected to the gate G1. Each combination of voltage ($V_{g+1}, \ldots V_{g+O}$) with one or more of the current sources ($I_{gon1}, \ldots I_{gonM}$) offers a different switching slew rate for turning on the IGBT 942. Similarly, the gate driver 513 can select one of the voltages ($V_{g-1}, \ldots V_{g-K}$) with one of the current sources 926 ($I_{goff1}, \ldots I_{goffL}$) or multiple current sources 926 ($I_{goff1}, \ldots I_{goffL}$) arranged in parallel and put the selected combinations of voltages and current sources in series. This combination can then be connected to the IGBT 942. Each combination of voltage ($V_{g-1}, \ldots V_{g-K}$) with one or more of current sources 926 ($I_{goff1}, \ldots I_{goffL}$) offers a different switching slew rate for turning off the IGBT 942. In another example, the current sources 924 and 926 can be used in connection with the MOSFET 928.

A further aspect of the disclosure allows the HGD to control SRs for the purpose of reducing deadtime. Another potential shortcoming of the hybrid switch shown in the various figures is that one type of semiconductor may need a larger switching delay time than the other in a hybrid power switch. For example, in the case of the IGBT/MOSFET hybrid switch, the IGBT needs a much larger switching delay time, which increases deadtime and its associated losses. For example, the IGBT voltage pulse across the collector and emitter will take a longer time to turn on than the MOSFET (whose non-gate terminals are connected respectively to the non-gate terminals of the power MOSFET) and also a longer time to turn off than the MOSFET. These delays and their resulting losses may be resolved by the HGD increasing the gate current into or out of the IGBT at both the turning on and turning off periods to shorten the switching delay time. The ratio of increased current through the IGBT versus the current through the MOSFET may be calculated in advance using the properties of the respective transistors, the circuit, and the power module parasitics in which the transistors are operating. The result is reduced dead time, reduced inverter loss, and improved efficiency of the motor being driven by the PM with the hybrid switches.

In still another aspect of the disclosure, the HGD may be configured to balance the switching speeds of the two or more transistors of the hybrid switch to optimize current sharing. The problem originates from the fact that semiconductor dies of different technologies, different parasitic inductances of the dies in the power module, or different part-to-part variation from die to die (i.e., Vth), switch at different speeds. Faster switching dies generate risks of overcurrent and worse, thermal runaway. Thermal runaway is a self-reinforcing phenomenon wherein increased collector current (e.g., in an IGBT) increases temperature. The increased temperature, in turn, causes further increased collector current, which again increases the temperature, thereby further increasing the current, and so on. Destruction of the transistor may result. As another example, a test run in a laboratory may indicate that as currently configured, a particular semiconductor manufacturer's specification may indicate that a 50-Ampere rated SiC MOSFET may support an instantaneous current of 294 Amps. The specification may indicate, however, that the same MOSFET transistor may not support 300 Amp operation for 500 ns. Accordingly, the HGD should modify the slew rates to reduce either the amplitude or the duration of the peak current through the MOSFET, or both. When these SR adjustments are optimized for the hybrid switch including the MOSFET(s) and other transistor(s), the other harmful phenomena may be reduced for the other transistor(s) in the hybrid switch as well. For different HGD proposed, the $R_g$ and $I_g$ can be external circuit or integrated inside 513 or inside the power module.

In various aspects, the HGD may be configured to address this issue up front by balancing the relative switching speeds of the SiC and IGBT in this example or different dies in a power module in a manner that optimizes current sharing between the devices while also controlling the overshoot, switching losses, and voltage and current-based SRs. An optimal sharing of current may balance the switching speeds in the hybrid switch, but also may reduce the above-described thermal stress, improve device reliability, and prolong transistor life, while increasing output current capability. To accomplish these objectives, the HGD may employ SR control in a manner that (i) maintains different types of semiconductors within their safe operating areas, (ii) achieves current balance for different ratios of WBG and non-WBG semiconductors, and (iii) mitigates degradation caused by overshoot and mismatch. Referring back to FIG. 2, the overshoot of the voltage $V_{ds}$ and current $I_{ds}$ may be reduced using current sharing, thereby enabling the overshoot and ringing phenomena to be reduced to values that are within stated specifications.

Another aspect of the disclosure may provide top-level control for hybrid switches. Taking the example of an electric vehicle (EV), the EV operates under various operating conditions, including, for example, speed, load, junction temperature, and others. That same EV may have a variety of functions to accommodate one or more of these operating conditions. They may include a maximum power mode, a heat or energy recovery function, and a transistor safe turn-off function when a short circuit occurs, among many other potential types and categories of functions. In an embodiment, the HGD may be configured to perform one or more of the above-referenced functions to automatedly categorize different slew rates for the hybrid switch, optimal for different EV operating conditions. For example, the vehicle may maintain a set of different slew rates that may be organized using various factors. Examples of these factors include the "revolutions per minute" or equivalent value of the motor, the standard operating conditions, the power transistor current ratings, the instantaneous or maximum torque of the EV, the operating power, and various degradations of different parameters. In addition, actual or rated power, city versus highway driving may be used by the MCU or processor in determining the SR amongst a number of different SRs that correspond to different sets of categories. In these cases, the number of the SR closest to the criteria deemed relevant by the processor may be employed, and the SRs in the hybrid switches may be modified in accordance with the rules and criteria set forth in memory for the problem(s) at issue. In additional embodiments, one or more of the SR categories may include "real time" functionality in which different SR values are also modified based on current conditions in the automobile. In other embodiments, the various conditions may first each be elicited before selecting the SR category, after which the SR category may perform its mitigating actions, while the hybrid switch currents, voltages and other parameters are tested in real time to verify performance improvement. In sum, an SR category may include, for a given set of EV operating conditions and functions, the concurrent reduction in switching losses, bearing currents, voltage overshoot, ringing, and EMI.

It should be noted that, while the micro-controller unit (MCU) may be the MCU integrated into a dedicated ECU or network thereof, for purposes of this disclosure, the terms "MCU" and "processor" may constitute more than one processor. The terms may refer to each kind of controller or microcontroller for executing various tasks enumerated in this disclosure, including the analysis and modification of SRs, current sharing, and reduction in deadtime. In some cases, at least part of the processor may include dedicated hardware, such as in a digital signal processor (DSP). The processor may also be implemented (in part or in full) with an application specific integrated circuit (ASIC), a System on a Chip (SoC), combinational Boolean logic circuits that perform the requisite digital functions, a field-programmable gate array (FPGA) Application Specific Integrated Circuits (ASICs), or another type of programmable logic device (PLD). The transistors used in the processor may include complementary metal-oxide-semiconductor (CMOS) technology, bipolar junction transistors, Gallium-Arsenide transistors, or some combination thereof. The processor may execute middleware, and in some embodiments, it may rely at least partially on one or more application programming interfaces to communicate with other systems. The processor may also include upgradable firmware. The memory may be logically partitioned to include a database or repository, or relational or non-relational data tables.

The processing system may include memory (e.g., various levels of cache memory, dynamic random access memory (DRAM), static random access memory (SRAM), programmable read only memory (PROM), electrically erasable programmable read-only memory (EEPROM or EPROM), flash memory, magneto-based hard drives, solid state hard drives, and the like. The memories may include code stored therein and data. The collective structural and functional architecture of the processing system is intended to simplify the parlance and to acknowledge that the code may be executed using processors at separate locations, for example or in several diverse ways, just a few of which are described above.

In still another aspect of the disclosure, hybrid switch control may be employed based on motor or PIM current feedback. In a first relevant embodiment, the HGD may be configured to adjust the ratio of usage of non-WBG switches over WBG switches based on real time feedback of the motor or inverter current. For high currents, the HGD may be configured to favor the non-WBG device to carry the current. For low currents, by contrast, the HGD may be configured to equalize the ratio using a WBG device. Medium currents may entail adjustment of both semiconductor types and depend on the circuit configuration. In a second relevant embodiment, the HGD may be configured to control SRs based on the non-WBG/WBG ratio, the current, the motor and PIM/inverter temperatures, the switching frequency, and the PWM strategy, among other features and aspects.

The above-referenced embodiments may beneficially utilize SiC of the hybrid switch, if available, to switch faster for low and medium currents. This enables the IGBT to cool down during the SiC switching and carrying the current at low and medium values of current. Further, the SiC may cool down during the IGBT operation. These cooling periods enable faster switching frequency for both SiC and IGBT semiconductor elements. Cooler operation, in turn, reduces the hybrid switches'on resistance ($R_{DS}$ON) across the transistors, increasing inverter efficiency. Faster switching frequency also enables high motor efficiency, as it is understood that the motor losses are typically greater than the inverter losses. In addition, these embodiments optimize switching speed versus bearing current; that is, to provide ratios and SRs that allow for a fast switching speed and therefore a fast motor, while ensuring that the switching speed is not high enough to damage the bearings due to the parasitic bearing current. The SiC provides a faster switching speed up to a medium current.

To summarize various embodiments and benefits of the principles of the present disclosure, the gate driver may utilize current sources (CS) to provide or sink variable output currents to or out of the gates of the individual switches, dies or their combination, of the hybrid PM or individual die of a uni-PM to precisely control their switching SRs in real time. In another embodiment, an isolated apparatus based on a variable current source is configured to change the SR between and within a switching event to optimize the performance of the hybrid PM. That is to say, for purposes of this disclosure, the HGD may be construed to include the current sources as part of the HGD, or they may be construed as being coupled with the current sources. In still another embodiment, SR control is used to compensate for capacitance differences of the fast and slow switches of the hybrid PM with and without the PWM delay control. SR control may also be used by the HGD to compensate for parasitic inductance differences between the fast and slow switches of the hybrid PM with and without the PWM delay control.

SR control as described above may further be employed to reduce the reverse recovery current of the Si switches or diodes of the hybrid PM with and without the PWM delay control. SR control may also be used to reduce the deadtime of hybrid PM with and without the PWM delay control to reduce inverter and motor loss. Similarly, SR control may be used to reduce the Miller current of the hybrid PM with and without the PWM delay control to reduce the loss. In another embodiment, SR control may be used to mitigate the current-sharing imbalance of different switches in the hybrid PM with and without the PWM delay control. It should be underscored that these new apparatuses and methods are applicable for both voltage-source and current-source based GDs or hybrid GDs, as detailed above in FIGS. 5-8 and the accompanying text.

In another embodiment, the HGD may implement feed-forward control using look up tables (LUTs) in a memory or accessible from a network location to alter SRs based upon operating conditions, e.g., DC voltage, current, Vth, $R_{DS}$ON, junction temperatures, motor temperature, coolant temperature, inverter temperature, parasitic inductances, transistor signal sensing, and part-to-part variation and degradation, transistor on-resistance (Ron), and gate current sources for these conditions. The gate driver may in other embodiments include galvanic isolation integrated therein, or galvanic isolation may be implemented in a separate part.

Slew rate control may further be employed for capacitor discharge(s), for limiting current and voltage (I/V) overshoots, and for controlling the temperature, current, and voltage of the switch, capacitor and battery such that they are maintained within safe operating limits. SR control may also be implemented for multi-level turn-off to reduce soft turn-off time and device voltage overshoot when the switch is in short circuit. In still other embodiments, a diode may be added in an active Miller clamp circuit to protect the transistor gate from the Miller currents of the other transistors.

In other embodiments, the ratio of Non-WBG switch over WBG switch may be determined based on real time feedback of motor/inverter current to reduce temperatures and switching losses. The HGD may further control SRs based on the Non-WBG/WBG ratio, current, DC voltage, motor and inverter temperatures, switching frequency, PWM strategy, etc. Additionally, a controlled deadtime based on Vth measurement may be undertaken to take account of part-to-part variation and degradation.

It should also be noted that terminology in the claims similar to "current sources controlled by the PWM signals," "current sources controlled by the PWM outputs," "output stage of transistors controlled by PWM signals" and similar language, unless specifically defined otherwise, neither necessitates nor prohibits a direct connection between the current sources and the PWM outputs. For example, in some embodiments, the control may be intermediate and transistor circuits may lie between the output PWM signals and the current sources. Passive circuit elements, digital circuits (e.g., decoders), and other structures may exist between the PWM output and the current sources.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented herein.

What is claimed is:

1. A gate driver for providing slew rate (SR) control of a power module (PM), comprising:

a plurality of input ports for receiving pulse-width-modulation (PWM) control signals transmitted from a processing system;

a plurality of voltage sources and a plurality of gate resistors controlled by the PWM signals and having outputs coupled to a respective gate of at least one first transistor of a hybrid switch in the PM, wherein the hybrid switch includes the at least one first transistor and at least one second transistor each comprising different semiconductor technologies; and a plurality of current sources controlled by the PWM signals and having outputs coupled to respective gates of the at least one second transistor of the hybrid switch in the PM, wherein the plurality of voltage sources, the plurality of gate resistors, and the plurality of current sources are configured to provide the SR control of the PM to thereby compensate for the different semiconductor technologies in real time.

2. The gate driver of claim 1, wherein the plurality of voltage sources, the plurality of gate resistors, and the plurality of current sources are configured to provide the SR control of the at least one first transistor and the at least one second transistor for one or more of:

changing respective switching speeds; compensating for different input capacitances;

compensating for differences in parasitic values;

reducing a Miller current;

reducing common mode current;

reducing bearing current;

optimizing a reverse recovery current; reducing transistor deadtime;

optimizing current sharing between the at least one first transistor and the at least one second transistor; or providing top-level control of the hybrid switch.

3. The gate driver of claim 1, wherein the gate driver comprises an integrated apparatus physically separate from the processing system and the PM.

4. The gate driver of claim 1, wherein the SR control is configured to compensate for capacitance differences between the at least one first transistor and the at least one second transistor of the hybrid switch, either with or without using PWM delay control.

5. The gate driver of claim 1, wherein the SR control is configured to compensate for parasitic inductances between the at least one first transistor and the at least one second transistor of the hybrid switch, either with or without using PWM delay control.

6. The gate driver of claim 1, wherein the SR control is configured to reduce reverse recovery current between the at least one first transistor and the at least one second transistor of the hybrid switch or between a diode coupled between non-gate terminals of one of the at least one first transistor and the at least one second transistor.

7. The gate driver of claim 1, wherein the SR control is configured to reduce a deadtime of the PM either with or without using PWM delay control, to thereby reduce losses in an inverter with the PM or a motor coupled to the PM.

8. The gate driver of claim 1, wherein the SR control is configured to reduce a Miller current corresponding to the hybrid switch either with or without using PWM delay control.

9. The gate driver of claim 1, wherein the SR control is configured to mitigate a current-sharing imbalance between the at least one first transistor and the at least one second transistor of the hybrid switch either with or without using PWM delay control.

10. The gate driver of claim 1, wherein:

the PM builds an inverter, the inverter operable to drive a motor;

one of the at least one first transistor and the at least one second transistor of the hybrid switch comprises a wide bandgap (WBG) semiconductor and another of the at least one first transistor and the at least one second transistor comprises a non-WBG transistor; and the SR control is configured to use feedforward control with look-up tables (LUTs) to alter a SR of the hybrid switch based upon operating conditions.

11. The gate driver of claim 10, wherein the operating conditions include one or more of a drain-to-source voltage ($V_{DS}$), an input direct current voltage ($V_{DC}$), transistor threshold voltage $V_{TH}$, transistor on-resistance ($R_{DS}ON$), motor phase current, junction temperature, motor temperature, circuit temperature, a value of one or more gate resistors, a value of one or more voltage sources, or a value of one or more gate current sources with the operating conditions.

12. The gate driver of claim 10, wherein the gate driver is galvanically isolated from the processing system and the PM.

13. The gate driver of claim 1, wherein a turn-on procedure of the hybrid switch comprises:

a first time period in which at least one power transistor in an off-state has a steady positive value across non-gate terminals thereof, the steady positive value corresponding to an off-state, wherein at or near the end of the first time period, one of the plurality of current sources are configured to apply a high gate current rated to the at least one second transistor at a high switching speed, reducing deadtime and switching delay;

a second time period during which the one or more of the current sources are configured to reduce a switching speed of the at least one second transistor by applying a lower, non-zero current to the respective gates of the hybrid switch to reduce dI/dt, overshoot, and ringing, while increasing switching speed;

a third time period during which one or more of the plurality of current sources are configured to reduce a value of the respective gate currents to reduce dV/dt, overshoot, and ringing; and a fourth time period during which the one or more of the plurality of current sources are configured to increase a value of the respective gate currents to a high or near maximum value to minimize an on-resistance across the at least one power transistor and to minimize conduction losses.

14. A vehicle, comprising:

a frame defining a body and a passenger cabin;

a processing system coupled to a gate driver within the body and configured to send pulse width modulation (PWM) signals to the gate driver;

a plurality of voltage sources in the gate driver under control of the PWM signals;

a plurality of gate resistors in the gate driver under control of the PWM signals;

a plurality of current sources in the gate driver under control of the PWM signals; and a polyphase inverter comprising, for each phase of a motor coupled to the inverter, one or more hybrid sets of switching transistors of different semiconductor technologies, wherein each of the current sources in the gate driver is coupled to a gate and at least one other terminal of a respective one of the hybrid sets of switching transistors, wherein each of the plurality of voltage sources and gate resistors in the gate driver is coupled to a gate and at least one other terminal of another respective one of the hybrid sets of switching transistors; and wherein the plurality of gate resistors and the plurality of current sources are configured to provide slew rate (SR) control of each respective phase of the inverter using respective variable gate resistance values and variable gate current values to compensate for the different semiconductor technologies in real time to reduce switching losses and improve inverter efficiency.

15. The vehicle of claim 14, wherein each of the plurality of gate resistors and the plurality of current sources are coupled to the one or more hybrid sets of transistors in each of the phases of the motor to control the SR for effective capacitor discharge, to limit current or voltage overshoots, to control a temperature, current and voltage of the switching transistors, and to maintain the capacitors of the switching transistors and a battery coupled to the inverter within a safe operating limit.

16. The vehicle of claim 14, wherein the gate driver is configured to control the SR to enable a multi-voltage level turn-off to reduce a soft turn-off time and to reduce voltage overshoot when the switch is in a short-circuit mode.

17. The vehicle of claim 14, wherein the gate driver comprises an active Miller clamp circuit to each of the one or more hybrid sets of switching transistors and a diode disposed across the Miller clamp circuit, the diode to protect a gate of the clamp circuit from a Miller current of other transistors.

18. The vehicle of claim 14, wherein the processing system is further configured to adjust a ratio of usage of non-wide bandgap (WBG) switch(es) over WBG switch(es) based on feedback of the inverter or motor for reducing temperature and switching losses.

19. A hybrid gate driver apparatus for providing slew rate (SR) control of a power inverter module (PIM), comprising:

a plurality of input terminals for receiving pulse-width-modulation (PWM) control signals transmitted from a processing system; and a plurality of voltage sources and a plurality of gate resistors controlled by the PWM signals and having outputs coupled to a gate of at least one transistor of a switch in the PIM, the transistor includes a single semiconductor technology, at least one of the plurality of voltage sources coupled to at least one other non-gate terminal of the transistor; and a plurality of current sources controlled by the PWM signals and having outputs coupled to the gate of the at least one transistor of the switch in the PM, at least one of the plurality of current sources coupled to the at least one other non-gate terminal of the transistor, wherein the plurality of gate resistors, the plurality of voltage sources, and the plurality of current sources are configured to provide the SR control of the PIM to compensate for the different semiconductor technologies in real time to reduce switching losses and improve PM efficiency.

20. The apparatus of claim 19, wherein the transistor includes one of a wide bandgap (WBG) semiconductor or a non-WBG transistor.

* * * * *